(12) United States Patent
Sunohara et al.

(10) Patent No.: US 7,057,290 B2
(45) Date of Patent: Jun. 6, 2006

(54) ELECTRONIC PARTS PACKAGING STRUCTURE AND METHOD OF MANUFACTURING THE SAME

(75) Inventors: Masahiro Sunohara, Nagano (JP); Kei Murayama, Nagano (JP); Toshinori Koyama, Nagano (JP); Kazutaka Kobayashi, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/771,506

(22) Filed: Feb. 5, 2004

(65) Prior Publication Data

US 2004/0178510 A1    Sep. 16, 2004

(30) Foreign Application Priority Data

Feb. 13, 2003    (JP)    ............................. 2003-035156

(51) Int. Cl.
*H01L 23/48*    (2006.01)
*H01L 23/52*    (2006.01)
*H01L 29/40*    (2006.01)
*H01L 23/28*    (2006.01)

(52) U.S. Cl. ...................... 257/777; 257/778; 257/787; 257/723; 257/686

(58) Field of Classification Search ................ 723/723, 723/686, 787, 778, 777
See application file for complete search history.

(56) References Cited

U.S. PATENT DOCUMENTS

| 5,353,498 | A | * | 10/1994 | Fillion et al. .................. 29/840 |
| 5,780,776 | A | * | 7/1998 | Noda .......................... 174/255 |
| 5,870,289 | A | * | 2/1999 | Tokuda et al. .............. 361/779 |
| 2001/0004130 | A1 | | 6/2001 | Higashi et al. |

FOREIGN PATENT DOCUMENTS

| JP | 2000-323645 | 11/2000 |
| JP | 2001-177045 | 6/2001 |

* cited by examiner

*Primary Examiner*—Nitin Parekh
(74) *Attorney, Agent, or Firm*—Armstrong, Kratz, Quintos, Hanson & Brooks, LLP.

(57) ABSTRACT

An electronic parts packaging structure of the present invention includes a wiring substrate having a wiring pattern, a first insulating film which is formed on the wiring substrate and which has an opening portion in a packaging area where an electronic parts is mounted, the electronic parts having a connection terminal flip-chip mounted on the wiring pattern exposed in the opening portion of the first insulating film, a second insulating film for covering the electronic parts, a via hole formed in a predetermined portion of the first and second insulating films on the wiring pattern, and an upper wiring pattern formed on the second insulating film and connected to the wiring pattern through the via hole.

6 Claims, 14 Drawing Sheets

ELECTRONIC PARTS PACKAGING STRUCTURE AND METHOD OF MANUFACTURING THE SAME

BACKGROUND OF THE INVENTION

1. Field of the Invention

The present invention relates to an electronic parts packaging structure and a method of manufacturing the same. More specifically, the present invention relates to an electronic parts packaging structure in which a semiconductor chip or the like is mounted on a wiring substrate in the state where the semiconductor chip or the like is buried in an insulating film, and to a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

Based on demands for further density growth, a semiconductor device in which a plurality of semiconductor chips are three-dimensionally stacked and mounted on a wiring substrate has been developed. To cite an example, each of Patent Literature 1 (Japanese Unexamined Patent Publication No. 2001-177045) and Patent Literature 2 (Japanese Unexamined Patent Publication No. 2000-323645) discloses a semiconductor device having a structure as follows: a plurality of semiconductor chips are three-dimensionally mounted on a wiring substrate in the state where the semiconductor chips are buried in insulating films, and the plurality of semiconductor chips are mutually connected using multilayered wiring patterns or the like formed with the insulating films interposed therebetween.

However, in the above-described Patent Literatures 1 and 2, there is no consideration for the fact that an interlayer insulating film is formed in the state where steps are generated due to the thickness of a semiconductor chip when the interlayer insulating film is formed on the mounted semiconductor chip.

Specifically, if steps are generated in the interlayer insulating film on the semiconductor chip, defocus is apt to occur in photolithography when wiring patterns are formed on the interlayer insulating film. Accordingly, it is difficult to form desired wiring patterns with high precision.

Furthermore, since steps are also generated in the wiring patterns formed on the interlayer insulating film, reliability of bonding may be lowered when a semiconductor chip is flip-chip bonded to the wiring patterns.

SUMMARY OF THE INVENTION

An object of the present invention is to provide an electronic parts packaging structure having a structure in which an electronic parts is buried in an insulating film on a wiring substrate, wherein steps due to the thickness of the electronic parts is easily eliminated to be planarized, and to provide a method of manufacturing the same.

The present invention relates to an electronic parts packaging structure including a wiring substrate having a wiring pattern, a first insulating film which is formed on the wiring substrate and which has an opening portion in a packaging area where an electronic parts is mounted, the electronic parts having a connection terminal flip-chip mounted on the wiring pattern of the opening portion of the first insulating film, a second insulating film for covering the electronic parts, a via hole formed in a predetermined portion of the first and second insulating films on the wiring pattern, and an upper wiring pattern formed on the second insulating film and connected to the wiring pattern through the via hole.

In the present invention, the first resin film having the opening portion in the packaging area is formed on the wiring substrate, and the connection terminal of the electronic parts (thinned semiconductor chip or the like) is flip-chip mounted on the wiring pattern in the opening portion. Moreover, the second insulating film for covering the electronic parts is formed, and the via hole is formed in the first and second insulating films on the wiring pattern. Furthermore, the upper wiring pattern connected to the wiring pattern through the via hole is formed on the second insulating film.

As described above, in the present invention, the first insulating film is formed so as to surround the electronic parts. Therefore, the present invention has a structure in which steps due to the thickness of the electronic parts are eliminated with the first insulating film. Accordingly, the second insulating film for covering the electronic parts is formed in the state where the upper surface of the second insulating film is planar, without being affected by the thickness of the electronic parts.

Therefore, since defocus does not occur in photolithography when the upper wiring pattern is formed, the upper wiring pattern is stably formed with high precision.

Thus, the electronic parts is flip-chip mounted on the wiring pattern in the state where the electronic parts is buried in a planar insulating film, and the upper wiring pattern for three-dimensionally multilayering a plurality of electronic parts is formed on the second insulating film without the occurrence of any trouble. Furthermore, in the case where an upper electronic parts is flip-chip mounted on the upper wiring pattern, a connection portion of the upper wiring pattern is placed at substantially the same height. Accordingly, the upper electronic parts is bonded thereto with high reliability.

To cite a modification of the above-described invention, the second insulating film may be omitted by providing a protection film on the backside of the electronic parts. In this case, the upper wiring pattern is formed on the first insulating film and the protection film. Alternatively, the following structure may be adopted: without forming a via hole in the insulating film on the wiring pattern, a via hole penetrating the electronic parts is formed in a predetermined portion of the electronic parts on the connection terminal, and the upper wiring pattern is connected to the connection terminal through the via hole of the electronic parts.

In one preferred aspect of the aforementioned invention, the following may be adopted: the connection terminal of the electronic parts is made of gold, a gold film is formed on a surface of the wiring pattern in the opening portion of the insulating film, and the connection terminal of the electronic parts is flip-chip mounted on the wiring pattern by gold-gold bonding.

In this case, the first insulating film for eliminating steps due to the thickness of the electronic parts is also used as a mask layer for selectively forming the gold film on the wiring pattern (copper wiring or the like) in the opening portion (packaging area) of the first resin film. This makes it possible to easily flip-chip mount the electronic parts having the connection terminal made of gold on the wiring pattern by gold-gold bonding which provides high reliability of bonding.

Moreover, the present invention relates to an electronic parts packaging structure including a wiring substrate having a wiring pattern, a first insulating film formed on the wiring substrate which has an opening portion in a packaging area where an electronic parts is mounted, the electronic parts mounted in the packaging area of the opening portion of the first insulating film in a state where a connection portion is directed upward, a second insulating film for covering the electronic parts, via holes respectively formed in predetermined portions of the insulating films on the connection terminal and the wiring pattern, and upper wiring patterns which are formed on the second insulating film and which are respectively connected to the connection terminal and the wiring pattern through the via holes.

In the present invention, the first insulating film having the opening portion in the packaging area is formed on the wiring substrate, and the electronic parts is mounted in the opening portion in the state where the connection terminal is directed upward.

In the case where the electronic parts is mounted in this way, similar to the aforementioned invention, steps due to the thickness of the electronic parts are also easily eliminated with the first insulating film. Further, after the second insulating film for covering the electronic parts has been formed in a planar state, the via holes are formed in predetermined portions in the second insulating film on the connection terminal and the wiring pattern, respectively. In addition, the upper wiring patterns respectively connected to the connection terminal and the wiring pattern through the via holes are stably formed on the second insulating film with high precision.

To cite a modification of the above-described invention, the second insulating film for covering the electronic parts may be omitted by use of an electronic parts provided with a passivation film having an opening portion for exposing the connection terminal, on the element formation surface. In this case, the upper wiring patterns are formed on the insulating film and the passivation film.

DETAILED DESCRIPTION OF THE PREFERRED EMBODIMENTS

Hereinafter, embodiments of the present invention will be described with reference to the accompanying drawings.

First Embodiment

Figure 1A:
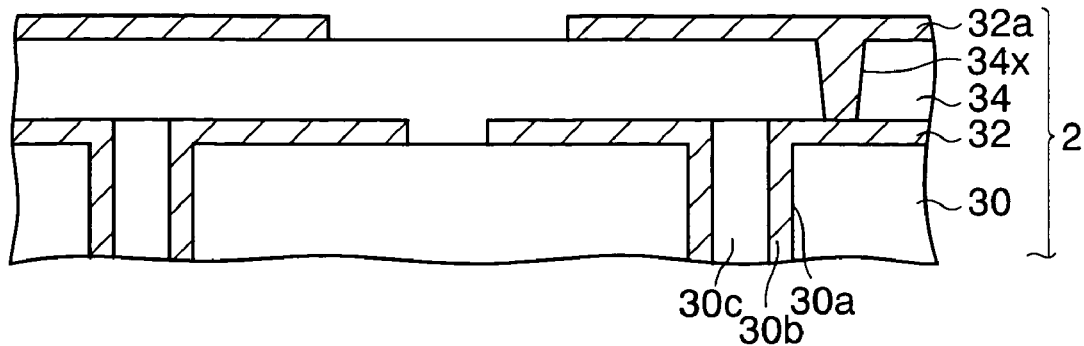
FIGS. 1A to 1N are sectional views showing a method of manufacturing an electronic parts packaging structure of a first embodiment of the present invention in order.
Figure 1B:
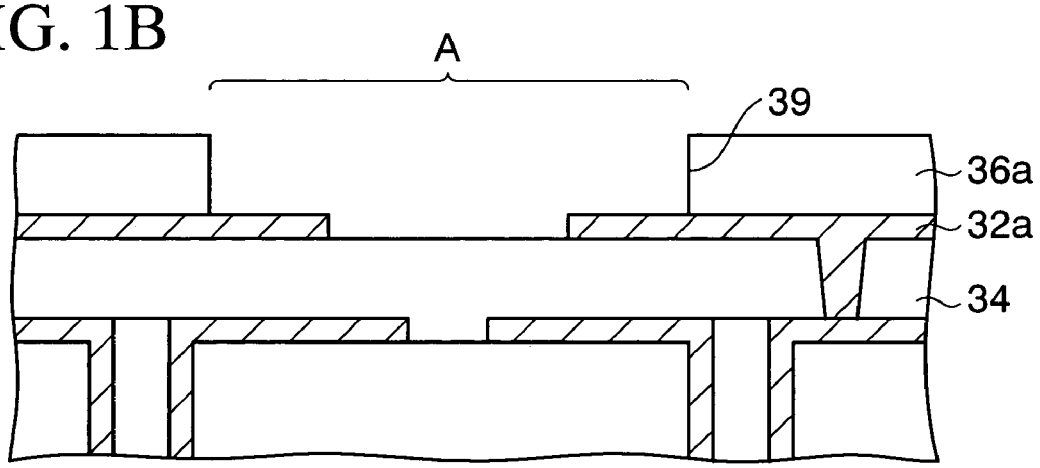
Figure 1C:
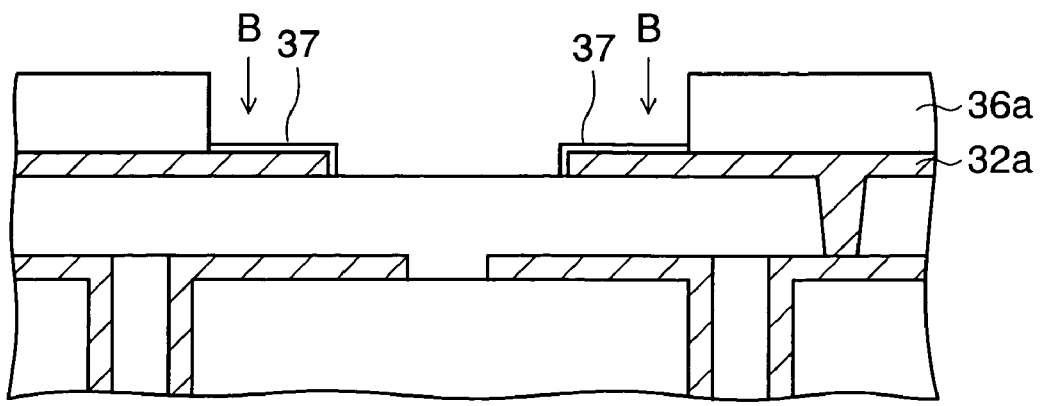
Figure 1D:
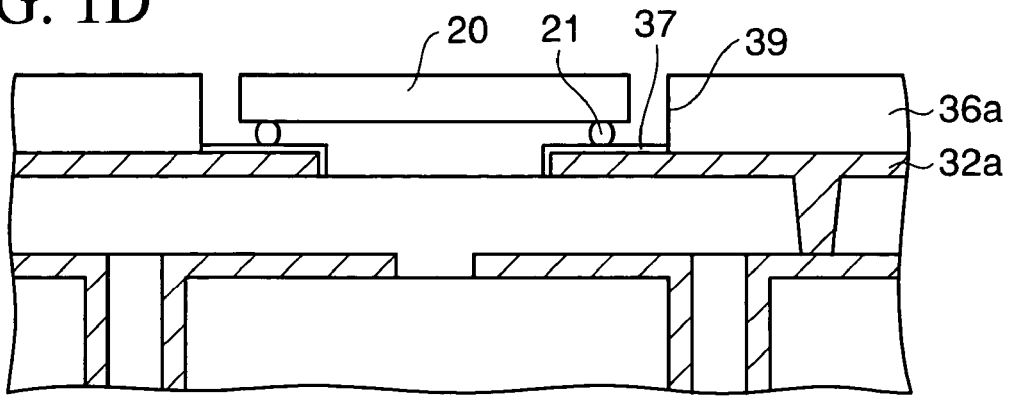
Figure 1E:
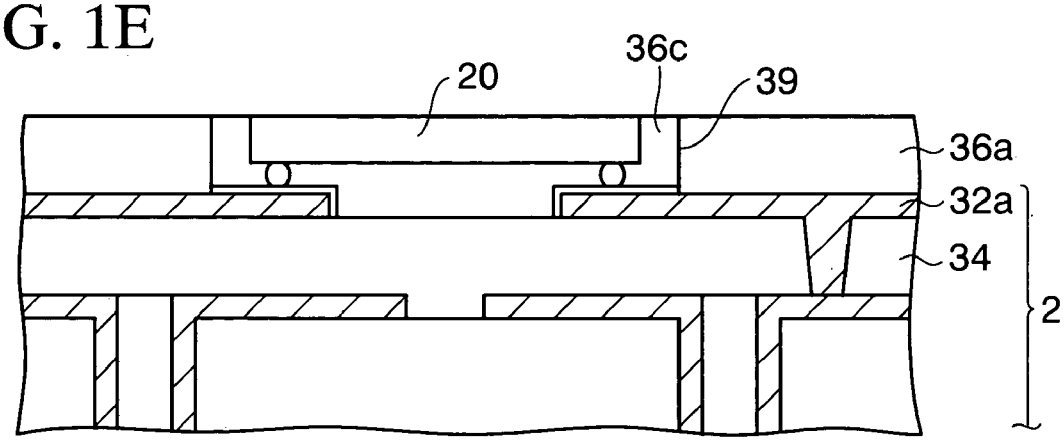
Figure 1F:
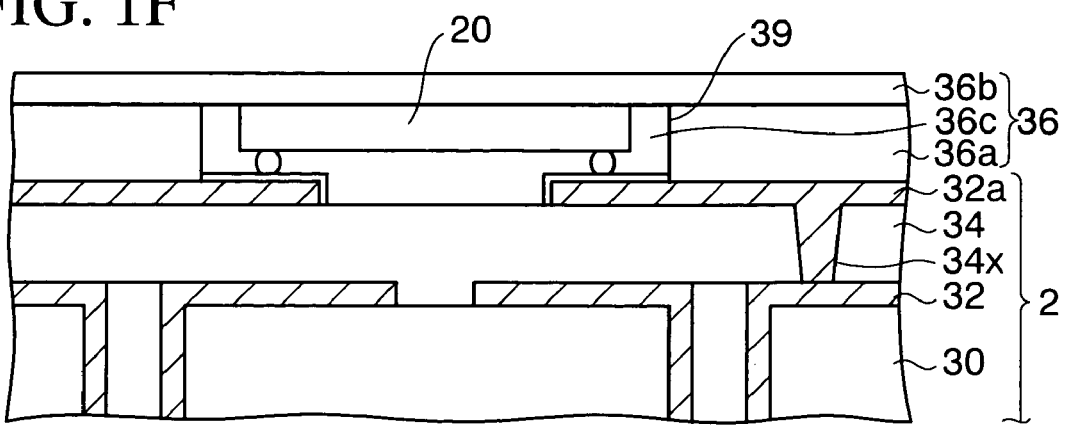
Figure 1G:
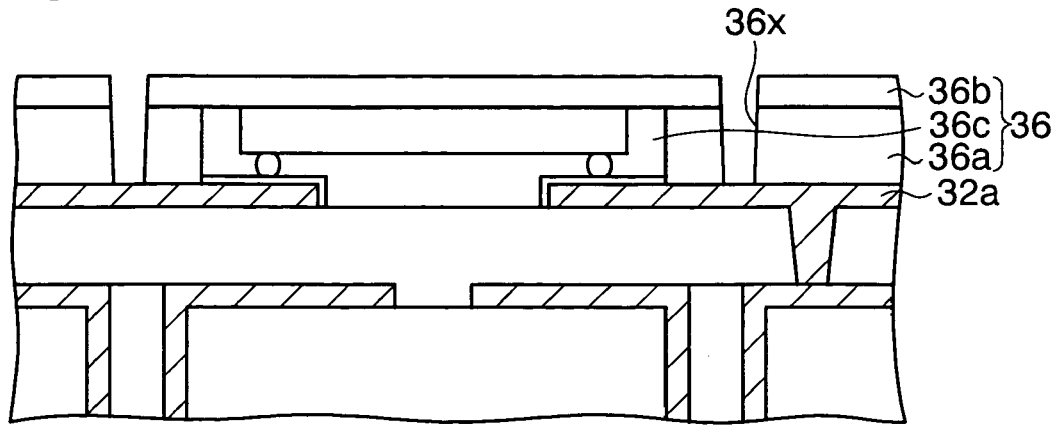
Figure 1H:
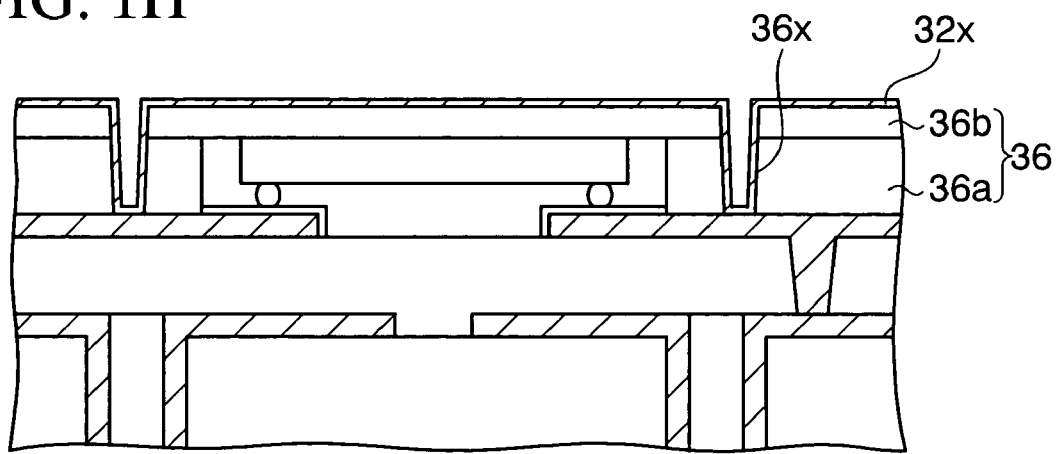
Figure 1I:
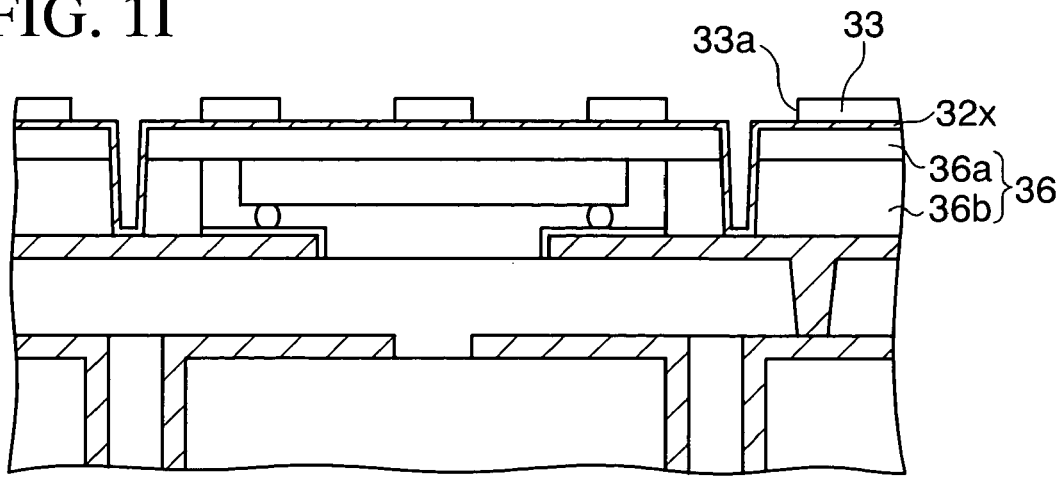
Figure 1J:
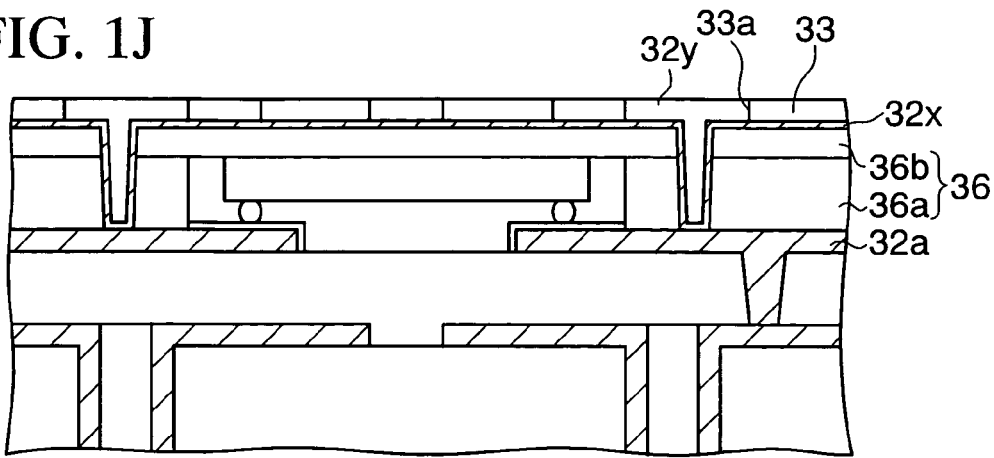
Figure 1K:
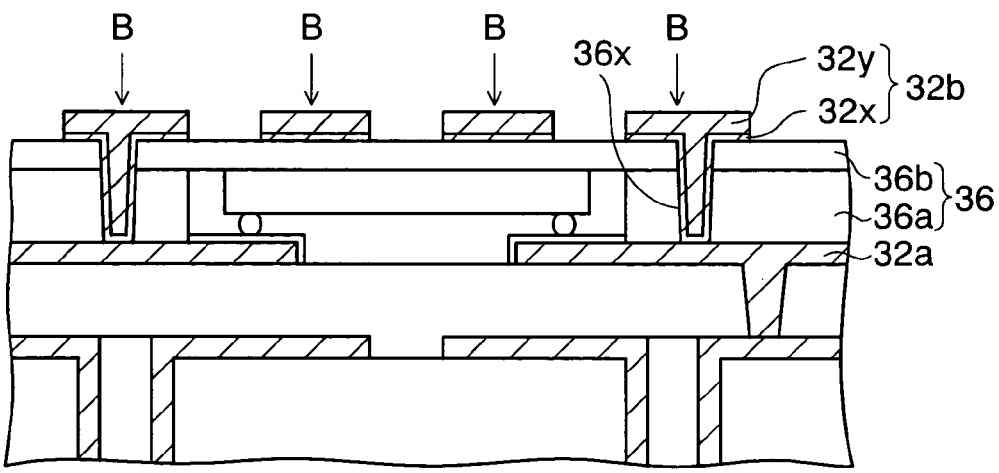
Figure 1L:
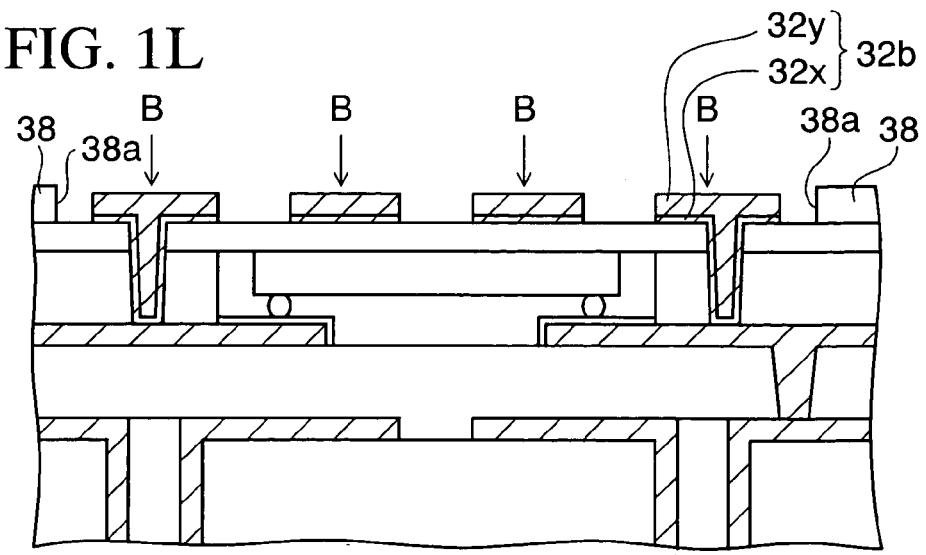
Figure 1M:
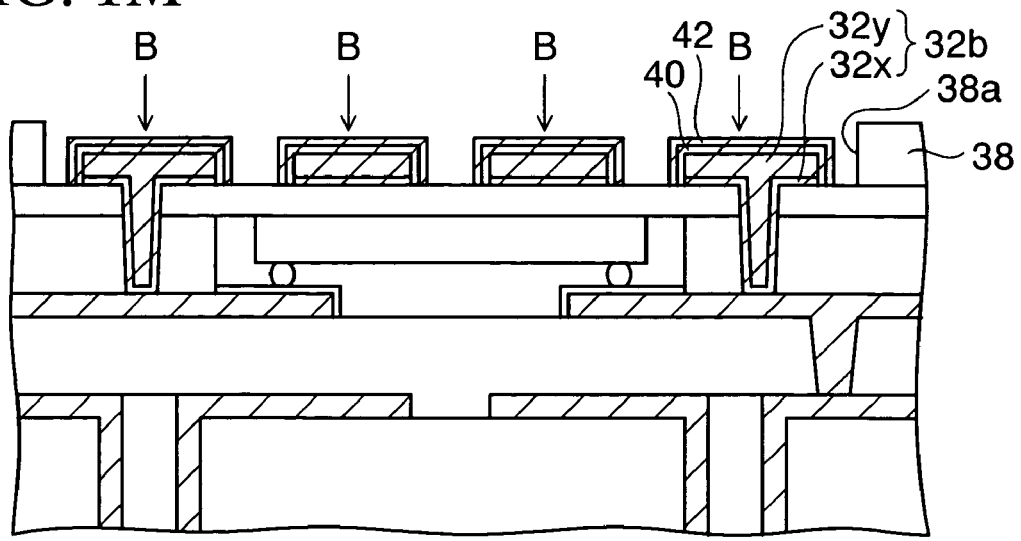
Figure 1N:
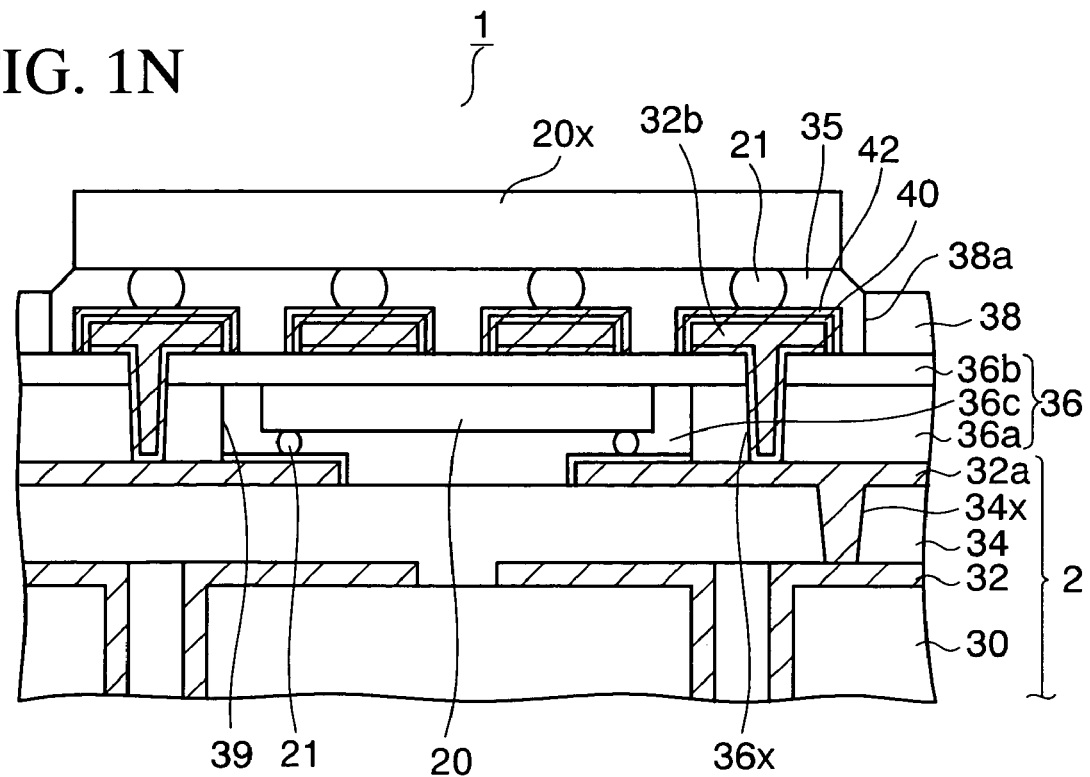

FIGS. 1A to 1N are sectional views showing a method of manufacturing an electronic parts packaging structure of a first embodiment of the present invention in order. In the method of manufacturing the electronic parts packaging structure of the first embodiment, as shown in FIG. 1A, first, a base substrate 30 for manufacturing a build-up printed circuit board is prepared. The base substrate 30 is made of insulative material such as resin. Through-holes 30a are provided in the base substrate 30, and through-hole plating layers 30b connected to first wiring patterns 32 on the base substrate 30 are formed on the inner surfaces of the through-holes 30a. Openings of the through-holes 30a are filled with a resin body 30c.

Thereafter, a first interlayer insulating film 34 made of resin or the like, which covers the first wiring patterns 32, is formed. Then, predetermined portions of the first interlayer insulating film 34 on the first wiring patterns 32 are etched by a laser, RIE, or the like, thereby forming first via holes 34x having depths reaching the first wiring patterns 32.

Subsequently, second wiring patterns 32a connected to the first wiring patterns 32 through the first via holes 34x are formed on the first interlayer insulating film 34. The second wiring patterns 32a are made of Cu wirings or the like and formed by a similar method to that of forming third wiring patterns to be described later. Thus, a wiring substrate 2, on which a semiconductor chip is mounted, is obtained.

Next, as shown in FIG. 1B, a first insulating film 36a having an opening portion 39 in a packaging area A, where the semiconductor chip is flip-chip mounted, on the second wiring patterns 32a and the first interlayer insulating film 34, is formed.

For the first insulating film 36a, epoxy series resin, polyimide series resin, novolac series resin, acrylic series resin, or the like is used. Methods of forming the first insulating film 36a include a method of patterning a photosensitive resin film by photolithography. Alternatively, a method may be employed in which a film-like resin layer is laminated to be formed or a resin film is formed by spin coating or printing, and then the resin film is etched by a laser or RIE, thereby forming the opening portion. Moreover, a method may be adopted in which a desired portion of a film-like resin layer is stamped out with a die to form the opening portion, and the resin film is attached. Furthermore, a resin film may be patterned into a shape having the opening portion by screen printing.

Then, such a resin film is heat-treated at a temperature of 130 to 200° C. to be cured, thereby obtaining the first resin film 36a.

One feature of the present embodiment is that when a structure in which a semiconductor chip is mounted in the state of being buried in an insulating film is formed, steps due to the thickness of the semiconductor chip are easily eliminated. Accordingly, in the present embodiment, the first insulating film 36a having the opening portion 39 in the packaging area A is formed to a thickness corresponding to the thickness of a semiconductor chip, and the semiconductor chip is mounted in the opening portion 39. Thus, steps due to the thickness of the semiconductor chip are easily eliminated with the first insulating film 36a.

Therefore, the thickness of the first insulating film 36a is appropriately adjusted in accordance with the thicknesses of various kinds of semiconductor chips. In the case where a semiconductor chip thinned to a thickness of approximately 150 µm or less (preferably, 30 to 70 µm including the heights of bumps is used, the thickness of the first insulating film 36a is set to a thickness equivalent to that of such a semiconductor chip. Moreover, the opening portion 39 of the first insulating film 36a is preferably formed so as to surround a semiconductor chip to be mounted later.

Subsequently, as shown in FIG. 1C, gold (Au) films 37 having thicknesses of 0.1 to 1 μm are selectively formed by electroless plating on the second wiring patterns (Cu wirings) 32a exposed in the opening portion 39 of the first insulating film 36a. At this time, since the first insulating film 36a is made of a cured resin film, the first insulating film 36a is resistant to plating chemical for electroless plating. Note that the Au films 37 may be formed after nickel (Ni) films have been formed as barrier films on the second wiring patterns (Cu wirings) 32a by electroless plating.

As described above, in addition to eliminating steps due to the thickness of a semiconductor chip when the semiconductor chip is mounted as described later, the first insulating film 36a also functions as a mask layer for selectively forming the Au films 37 on connection portions B of the second wiring patterns (Cu wirings) 32a in the packaging area A.

Next, a semiconductor chip 20 having Au bumps 21 as shown in FIG. 1D is prepared. The semiconductor chip 20 is obtained as follows: a semiconductor wafer (not shown), which has elements, such as transistors, and connection pads on an element formation surface, is thinned to a thickness of approximately 150 μm (preferably, approximately 50 μm or less by grinding the backside of the semiconductor wafer, and then the semiconductor wafer is diced to be divided into individual pieces. The Au bumps 21 of the semiconductor chip 20 are formed on the connection pads before or after the semiconductor wafer is diced.

Although the semiconductor chip 20 has been cited as an example of an electronic parts, various kinds of electronic parts including capacitor parts can be used. Note that the connection pads and the bumps 21 of the semiconductor chip 20 are examples of connection terminals.

Subsequently, the semiconductor chip 20 picked up with an ultrasonic tool is placed on the Au films 37 of the connection portions B of the second wiring patterns 32a in the state where the Au bumps 21 of the semiconductor chip 20 are directed downward, and ultrasonic vibration is applied horizontally while pressure is applied downward. Thus, the Au bumps 21 of the semiconductor chip 20 and the Au films 37 of the second wiring patterns 32a are bonded together. In this way, the semiconductor chip 20 is mounted on the second wiring patterns 32a by ultrasonic flip-chip bonding.

At this time, the size of the opening portion 39 of the first insulating film 36a is preferably adjusted in accordance with the size of the semiconductor chip 20 so that a gap of 0.5 to 2 mm (preferably, approximately 1 mm) may be left between the side surfaces of the semiconductor chip 20 and those of the opening portion 39.

By the above, the backside of the semiconductor chip 20 and the upper surface of the first insulating film 36a are at almost the same height, and steps due to the thickness of the semiconductor chip 20 are eliminated, because the first insulating film 36a is formed in an area except the packaging area A to almost the same thickness as that of the semiconductor chip 20 as previously described. Note that, of course, the height of the backside of the semiconductor chip 20 and that of the upper surface of the first insulating film 36a may be different from each other to a degree in which troubles do not occur in subsequent steps.

In addition, since the Au films 37 are selectively formed on the connection portions B of the second wiring patterns 32a using the first insulating film 36a as a mask, the connection portions B of the second wiring patterns 32a and the Au bumps 21 of the semiconductor chip 20 can be bonded by Au—Au bonding at low cost.

In general, in the case where the Au bumps 21 of the semiconductor chip 20 are flip-chip mounted on the second wiring patterns 32a made of Cu films, bonding failures are apt to occur because of low reliability of Au—Cu bonding. However, by adopting Au—Au bonding as in the present embodiment, electric resistance associated with the bonding can be lowered, and reliability of the bonding can be improved.

As described above, eliminating steps due to the thickness of the semiconductor chip 20 by forming the first insulating film 36a having the opening portion 39 in the packaging area A is very convenient for the case where the Au bumps 21 of the semiconductor chip 20 and the second wiring patterns 32a are bonded by Au—Au bonding, because the Au films 37 can be selectively formed on the connection portions B of the second wiring patterns 32a.

Incidentally, Cu wirings having no Au films formed on the surfaces thereof is used as the second wiring patterns 32a, and the semiconductor chip 20 having solder bumps may be flip-chip bonded to the Cu wirings of the second wiring patterns 32a. Alternatively, the semiconductor chip 20 having solder bumps may be flip-chip bonded to the second wiring patterns 32a having the Au films 37 formed on the surfaces thereof as previously described. Of course, other various kinds of flip-chip mounting may be employed.

To cite a modified example of a method of obtaining a structure in which the semiconductor chip 20 is mounted in the opening portion 39 of the first insulating film 36a as previously described, a resin film having an opening portion in an area corresponding to the packaging area A may be attached after the semiconductor chip 20 is flip-chip mounted on the second wiring patterns 32a in the packaging area A. In this case, the opening portion of the resin film is stamped out with a die to be formed in advance.

Next, as shown in FIG. 1E, resin material is injected from the gap between the semiconductor chip 20 and the opening portion 39 of the first insulating film 36a, thereby filling the gap between the semiconductor chip 20 and the wiring substrate 2 and the gap between the semiconductor chip 20 and the side surfaces of the opening portion 39 of the first insulating film 36a with the resin material. Thereafter, the resin material is cured by heat treatment to become underfill resin 36c (filling insulating film). Thus, the backside of the semiconductor chip 20, the upper surface of the underfill resin 36c, and the upper surface of the first insulating film 36a are at almost the same height to be planarized.

Note that the underfill resin 36c may be formed as follows: insulating resin (NCF or NCP) is previously coated in a predetermined area including the packaging area A before the semiconductor chip 20 is flip-chip mounted, flip-chip bonding is performed in the state where this resin is interposed therebetween, and then the resin is cured by heat treatment to become the underfill resin 36c.

Moreover, it is sufficient that the underfill resin 36c fills at least the gap between the under surface of the semiconductor chip 20 and the wiring substrate 2. This is because, even if concave portions remain in the gap between the side surfaces of the semiconductor chip 20 and those of the opening portion 39 of the first insulating film 36a, the concave portions are filled with a second insulating film, which is formed in the next step, to be planarized.

Subsequently, as shown in FIG. 1F, the second insulating film 36b having a thickness of 5 to 20 μm, which covers the semiconductor chip 20, is formed. For the second insulating film 36b, epoxy series resin, polyimide series resin, polyphenylene ether series resin, or the like is used. Moreover, as a method of forming the second insulating film 36b, a method of laminating a resin film or a method of forming a resin film by spin coating or printing and then curing the resin film by heat treatment at a temperature of 130 to 200° C. is employed.

At this time, the second insulating film 36b is formed on an underlying structure in which steps due to the thickness of the semiconductor chip 20 are eliminated. Accordingly, the second insulating film 36b is formed in the state where the upper surface thereof is planarized without being affected by the thickness of the semiconductor chip 20.

Thus, a second interlayer insulating film 36 in a planarized state, which is composed of the first insulating film 36a, the underfill resin 36c, and the second insulating film 36b, is obtained. In this way, a structure in which the semiconductor chip 20 is flip-chip mounted on the second wiring patterns 32a in the state where the semiconductor chip 20 is buried in the second interlayer insulating film 36 is formed.

Subsequently, as shown in FIG. 1G, predetermined portions of the second interlayer insulating film 36 on the second wiring patterns 32a are etched by a YAG or $CO_2$ laser or RIE, thereby forming second via holes 36x having depths reaching the second wiring patterns 32a.

Next, as shown in FIG. 1H, a seed Cu film 32x is formed on the inner surfaces of the second via holes 36x and on the second interlayer insulating film 36 by electroless plating or sputtering. Thereafter, as shown in FIG. 1I, a resist film 33 having opening portions 33a corresponding to third wiring patterns to be formed later is formed on the seed Cu film 32 by photolithography. At this time, since the second interlayer insulating film 36 is formed in a planarized state over all, defocus does not occur in photolithography. Therefore, a necessary pattern of the resist film 33 is stably formed with high precision.

Subsequently, as shown in FIG. 1J, using the resist film 33 as a mask, Cu film patterns 32y are formed in the second via holes 36x and the opening portions 33a of the resist film 33 by electroplating in which the seed Cu film 32x is utilized as a plating power-supply layer.

Then, after the resist film 33 is removed, the seed Cu film 32x is etched using the Cu film patterns 32y as a mask.

Thus, as shown in FIG. 1K, third wiring patterns 32b (upper wiring patterns) which are composed of the seed Cu films 32x and the Cu film patterns 32y are formed on the second interlayer insulating film 36. These third wiring patterns 32b are connected to the second wiring patterns 32a through the second via holes 36x.

The third wiring patterns 32b are formed in the condition demarcated with the pattern of the resist film 33 formed with high precision. Therefore, the third wiring pattern 32b required can be stably obtained.

The second and third wiring patterns 32a and 32b may be formed through a subtractive process or a fully-additive process other than the aforementioned semi-additive process.

Incidentally, a mode in which a plurality of semiconductor chips 20 are multilayered to be mutually connected in the state of being buried in respective interlayer insulating films, may be formed by repeating the process from the step (FIG. 1B) of forming the first insulating film 36a having the opening portion 39 in the packaging area A of the wiring substrate 2 to the step (FIG. 1K) of forming the third wiring patterns 32b with a predetermined number of times. In such a case, each interlayer insulating film is also formed in a planarized state. Accordingly, interlayer insulating films having semiconductor chips therein and wiring patterns can be formed in a stacking manner without the occurrence of any trouble.

Further, a mode in which semiconductor chips 20 are similarly buried in arbitrary interlayer insulating films among the plurality of interlayer insulating films may also be adopted. Furthermore, a mode in which a semiconductor chip 20 is also stacked on the backside of the base substrate 30 in the state where the semiconductor chip 20 is similarly buried in an interlayer insulating film may also be adopted.

In FIG. 1K, the sections of connection portions B, to which bumps of an upper semiconductor chip are connected later, in the third wiring patterns 32b are drawn.

Next, as shown in FIG. 1L, a solder resist film 38 having an opening portion 38a for exposing the connection portions B of the third wiring patterns 32b in a lump is formed. In other words, the solder resist film 38 is formed so as to surround a packaging area where the upper semiconductor chip is mounted later.

In the present embodiment, as the connection portions B of the third wiring patterns 32b, fine ones at a pitch of approximately 150 μm (e.g., line: 100 μm, space: 50 μm) or less are illustrated. Accordingly, if a continuous solder resist film having opening portions for exposing respective main parts of the connection portions B of the third wiring patterns 32b is formed, there are cases where the opening portions of the solder resist film are formed in the state of being shifted from the main parts of the connection portions B due to displacement in the forming process. If the opening portions of the solder resist film are placed in the state of being shifted from the main parts of the connection portions B, the bonding areas between the bumps of the upper semiconductor chip and the connection portions B are reduced. Therefore, bonding failures and the like are apt to occur with decrease in the bonding strength of the bumps.

However, in the present embodiment, patterns of the solder resist film 38 are not formed in the packaging area where the connection portions B of the third wiring patterns 32b are placed, but the opening portion 38a is provided in the packaging area in a lump. Thus, in the connection portions B of the third wiring patterns 32b, troubles that the bonding area for flip-chip bonding becomes small do not occur.

Next, as shown in FIG. 1M, using the solder resist film 38 as a mask, nickel (Ni) films 40 and Au films 42 are selectively sequentially formed on the third wiring patterns 32b exposed in the opening portion 38a by electroless plating. Note that the Ni films 40 may be omitted in the case where barrier films are not required.

Subsequently, as shown in FIG. 1N, the upper semiconductor chip 20x (upper electronic parts) having bumps 21 is prepared, and the bumps 21 of the upper semiconductor chip 20x are flip-chip bonded to the Au films 42 of the connection portions B of the third wiring patterns 32b. As the bumps 21 of the upper semiconductor chip 20x, Au bumps or solder bumps are used. In the case where Au bumps are used, Au—Au bonding is performed using ultrasonic waves. Meanwhile, in the case where solder bumps are used, bonding is performed by reflow heating.

At this time, the solder resist film 38 does not exist in the packaging area where the connection portions B of the third wiring patterns 32b are placed. Accordingly, the bumps 21 of the upper semiconductor chip 20x are bonded to the connection portions B of the third wiring patterns 32b with high reliability in the state where necessary bonding areas can be obtained.

In addition, since the second interlayer insulating film 36 is formed in a planarized state over all, the respective connection portions B of the third wiring patterns 32b are placed at almost the same height. Therefore, the occurrence of bonding failures between the upper semiconductor chip 20x and the connection portions B of the third wiring patterns 32b is prevented.

Note that the following may be adopted: bumps are formed on the connection portions B of the third wiring patterns 32b by mounting solder bolls thereon, and connection terminals of the upper semiconductor chip 20x are bonded to these bumps.

In this way, even if the connection portions B of the third wiring patterns 32b are at a fine pitch of approximately 150 µm or less, the bumps 21 of the upper semiconductor chip 20x can be flip-chip bonded to the connection portions B of the third wiring patterns 32b with high reliability.

At this time, it is preferred that the size of the opening portion 38a of the solder resist film 38 is appropriately adjusted in accordance with the size of the upper semiconductor chip 20x so that the dimensions from the peripheral portion of the upper semiconductor chip 20x to the side surfaces of the opening portion 38a of the solder resist film 38 may be 0.5 to 2 mm (preferably, approximately 1 mm).

Thereafter, again as shown in FIG. 1N, the gap between an element formation surface (under surface) of the upper semiconductor chip 20x and the third wiring patterns 32b and the gap between the element formation surface of the upper semiconductor chip 20x and the second interlayer insulating film 36 are filled with underfill resin 35. The underfill resin 35 is filled in the gap under the under surface of the upper semiconductor chip 20x and formed in the state of being blocked by the side surfaces of the opening portion 38a of the solder resist film 38.

Incidentally, the above-described mode in which the solder resist film 38 is not formed in the packaging area where the respective connection portions B of the third wiring patterns 32b are placed is one preferred example when the upper semiconductor chip 20x having the bumps 21 at a fine pitch is flip-chip bonded. Therefore, a mode in which a solder resist film 38 having opening portions for the main parts of the respective connection portions B of the third wiring patterns 32b is continuously formed in the packaging area may be adopted.

In this way, a semiconductor device 1 (electronic parts packaging structure) of the first embodiment is completed.

In the semiconductor device 1 of the present embodiment, the first insulating film 36a having the opening portion 39 in the packaging area A of the wiring substrate 2 is formed. Moreover, the semiconductor chip 20 is flip-chip mounted on the connection portions B of the second wiring patterns 32a in the opening portion 39 of the first insulating film 36a. Furthermore, the gap under the under surface of the semiconductor chip 20 and the gap adjacent to the side surfaces thereof are filled with the underfill resin 36c in an integrated state.

Thus, the backside (upper surface) of the semiconductor chip 20, the upper surface of the first insulating film 36a, and the upper surface of the underfill resin 36c are adjusted to almost the same height, and planarized by eliminating steps due to the thickness of the semiconductor chip 20. Further, the second insulating film for covering the semiconductor chip 20 is formed in the state where the upper surface of the second insulating film is planarized.

Moreover, the semiconductor chip 20 is flip-chip mounted on the connection portions B of the second wiring patterns 32a in the state where the semiconductor chip 20 is buried in the planar second interlayer insulating film 36 composed of the first insulating film 36a, the second insulating film 36b, and the underfill resin 36c.

Further, the second via holes 36x are formed in predetermined portions of the second interlayer insulating film 36 on the second wiring patterns 32a, and the third wiring patterns 32b connected to the second wiring patterns 32a through the second via holes 36x are formed on the second interlayer insulating film 36.

On the second interlayer insulating film 36, the solder resist film 38 having the opening portion 38a, which opens, in a lump, the packaging area where the connection portions B of the third wiring patterns 32b are placed, is formed. The bumps 21 of the upper semiconductor chip 20x are flip-chip bonded to the connection portions B of the third wiring patterns 32b. Furthermore, the gap under the under surface of the upper semiconductor chip 20x is filled with the underfill resin 35.

As described above, in the semiconductor device 1 of the present embodiment, the semiconductor chip 20 is flip-chip mounted in the opening portion 39 of the first insulating film 36a partly constituting the second interlayer insulating film. The semiconductor device 1 of the present embodiment has a structure in which steps due to the thickness of the semiconductor chip 20 are eliminated with the first insulating film 36a.

Thus, since the second insulating film 36b for covering the semiconductor chip 20 is formed in the state where the upper surface of the second insulating film 36b is planar, the third wiring patterns 32b formed on the second insulating film 36b are stably formed with high precision. Moreover, since the connection portions B of the third wiring patterns 32b are placed at almost the same height, reliability of bonding between the bumps 21 of the upper semiconductor chip 20x and the connection portions B of the third wiring patterns 32b can be improved.

Therefore, a packaging structure in which a plurality of semiconductor chips 20 are three-dimensionally multilayered to be mutually connected in the state of being buried in respective interlayer insulating films is easily manufactured without the occurrence of any trouble.

Second Embodiment

FIGS. 2A to 2F are sectional views showing a method of manufacturing an electronic parts packaging structure of a second embodiment of the present invention in order. The second embodiment is different from the first embodiment in that a semiconductor chip having a protection film provided on the backside thereof is used and in that an insulating film for covering the semiconductor chip is not formed. In the second embodiment, similar steps to those of the first embodiment will not be further described in detail.

Figure 2A:
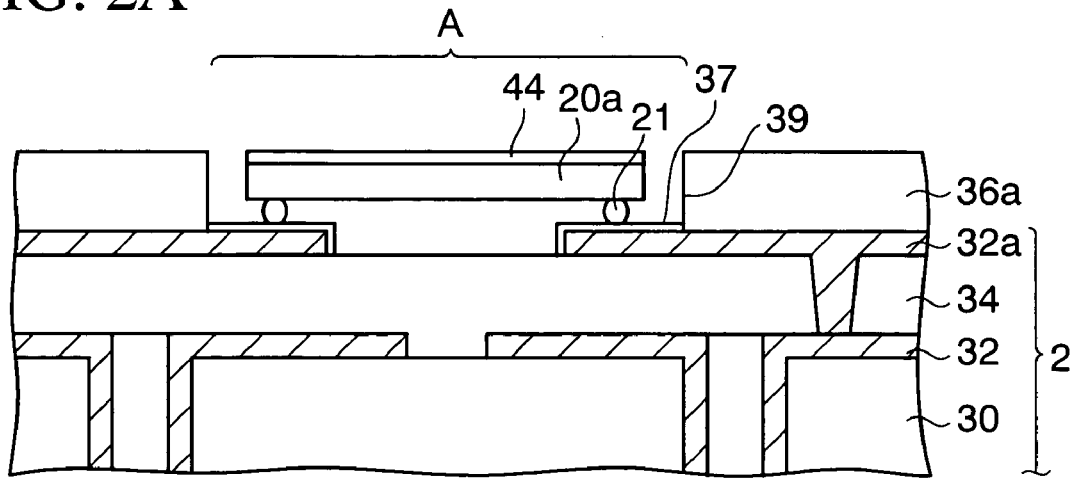
FIGS. 2A to 2F are sectional views showing a method of manufacturing an electronic parts packaging structure of a second embodiment of the present invention in order.

In the method of manufacturing the electronic parts packaging structure of the second embodiment, as shown in FIG. 2A, first, a wiring substrate 2 similar to that of FIG. 1C in the first embodiment is prepared. Thereafter, a semiconductor chip 20a (electronic parts) having bumps 21 on an element formation surface and having a protection film 44 of insulation provided on the backside thereof is prepared. Similar to the first embodiment, the semiconductor chip 20a is one thinned to a thickness of approximately 150 µm (preferably, approximately 50 µm) or less.

As material for the protection film 44, epoxy series resin, polyimide series resin, polyphenylene ether series resin, acrylic series resin, or the like is used. Moreover, as a method of forming the protection film 44, a method of laminating a resin film, a method of forming a resin film by spin coating or the dip method, or the like is employed. In the case where the adhesiveness between the semiconductor chip 20*a* and the protection film 44 is improved, the protection film 44 may be formed after silane coupling agent is coated on the backside of the semiconductor chip 20*a*.

Thereafter, again as shown in FIG. 2A, the bumps 21 of the semiconductor chip 20*a* are flip-chip bonded to Au films 37 of second wiring patterns 32*a* exposed in an opening portion 39 (packaging area A) of a first insulating film 36*a* by a similar method to that of the first embodiment.

Figure 2B:
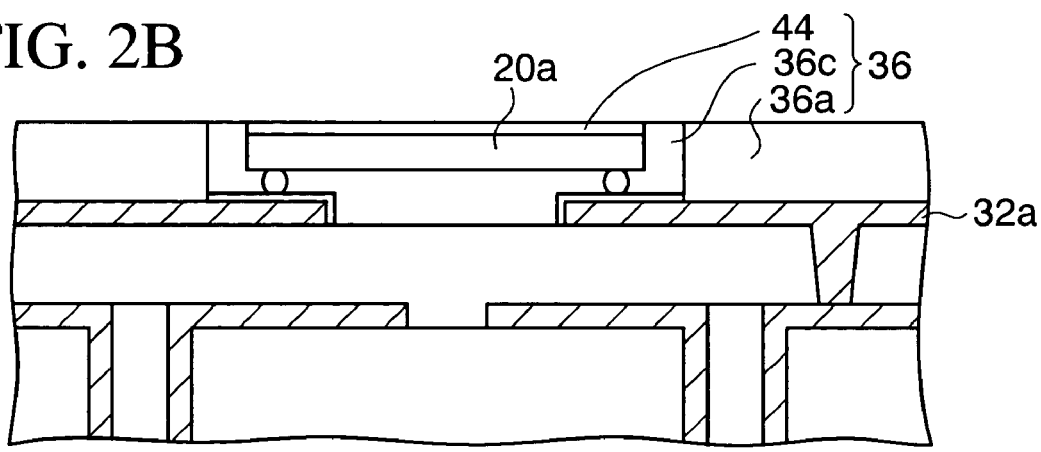

Then, as shown in FIG. 2B, similar to the first embodiment, the gap under the under surface of the semiconductor chip 20*a* and the gap adjacent to the side surfaces thereof are filled with underfill resin 36*c* (filling resin film). Thus, the upper surface of the insulating film 36*a*, the upper surface of the protection film 44 of the semiconductor chip 20*a*, and the upper surface of the underfill resin 36*c* come to be at almost the same height to be planarized.

In the second embodiment, since the semiconductor chip 20*a* having the protection film 44 on the backside thereof is used, a second insulating film does not need to be formed on the semiconductor chip 20*a*, unlike the first embodiment. Accordingly, in the present embodiment, a second interlayer insulating film 36 in which the semiconductor chip 20*a* is buried is composed of the insulating film 36*a*, the protection film 44, and the underfill resin 36*c*.

Figure 2C:
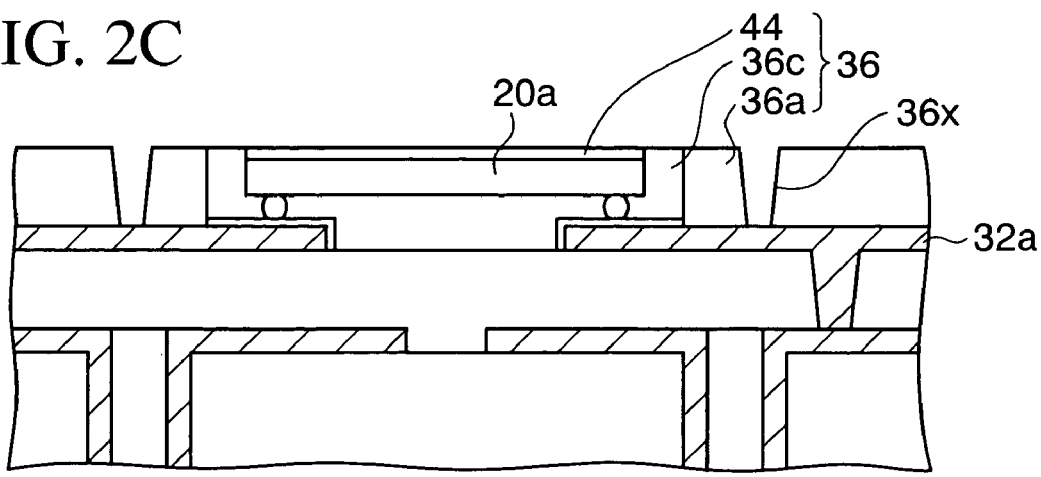

Next, as shown in FIG. 2C, predetermined portions of the second interlayer insulating film 36 on the second wiring patterns 32*a* are etched by a laser or RIE, thereby forming second via holes 36*x* having depths reaching the second wiring patterns 32*a*.

Figure 2D:
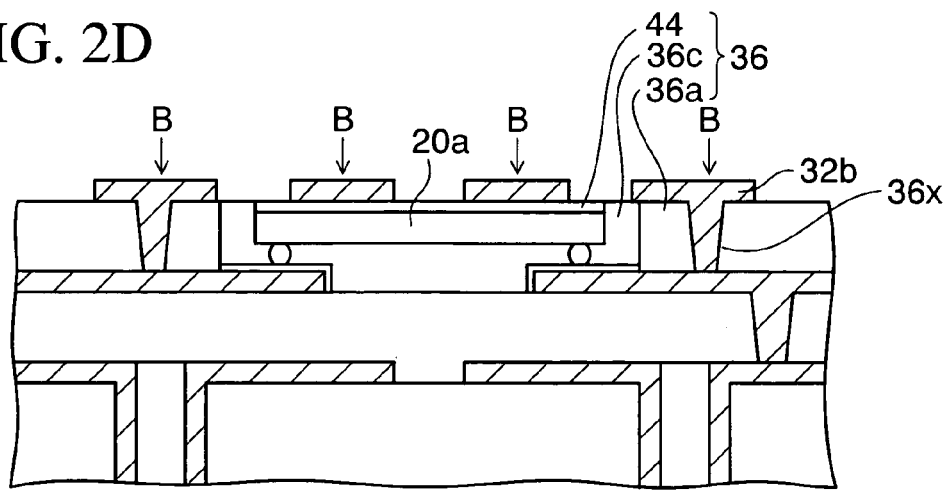

Subsequently, as shown in FIG. 2D, third wiring patterns 32*b* (upper wiring patterns) connected to the second wiring patterns 32*a* through the second via holes 36*x* are formed on the second interlayer insulating film 36 by a similar method to that of the first embodiment.

Figure 2E:
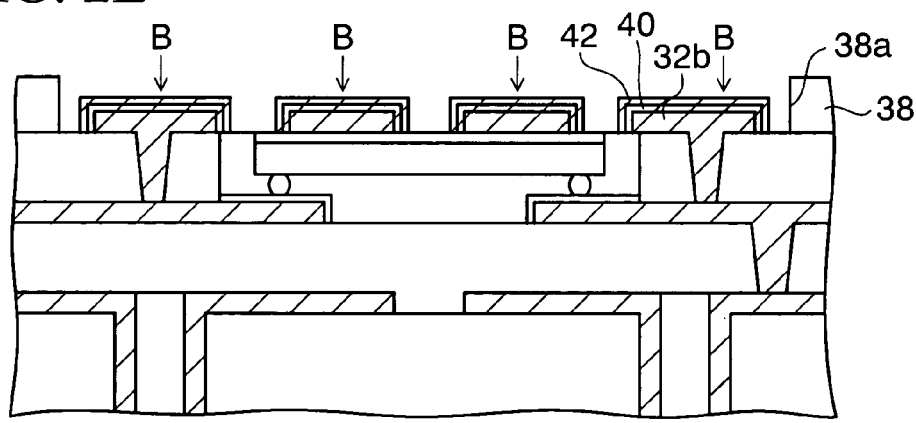

Then, as shown in FIG. 2E, similar to the first embodiment, a solder resist film 38 having an opening portion 38*a* for exposing respective connection portions B of the third wiring patterns 32*b* in a lump is formed on the structure of the FIG. 2D. Furthermore, Ni films 40 and Au films 42 are sequentially formed on the connection portions B of the third wiring patterns 32*b* by electroless plating.

Figure 2F:
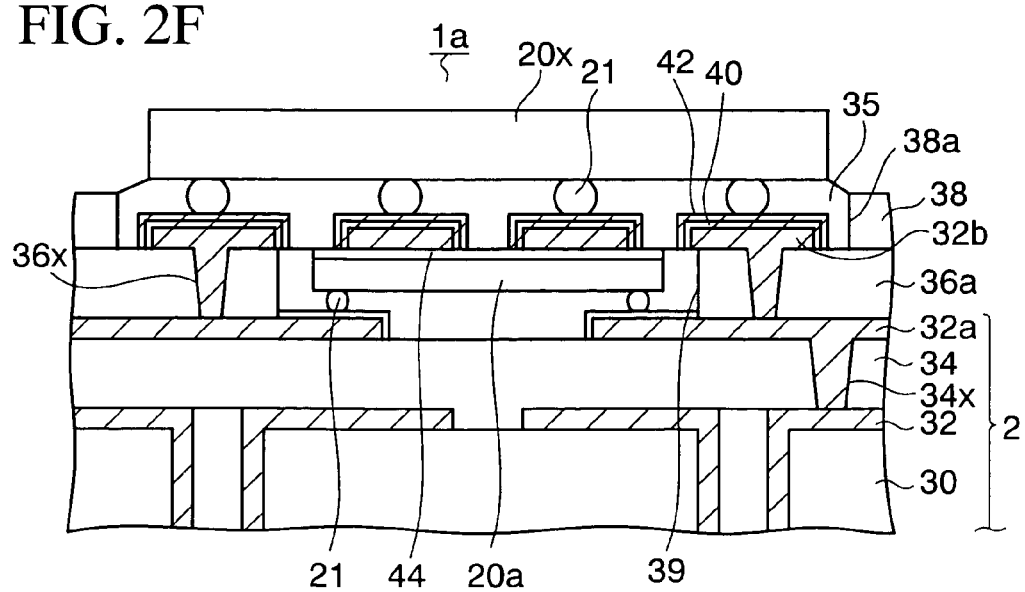

Next, as shown in FIG. 2F, bumps 21 of an upper semiconductor chip 20*x* (upper electronic parts) are flip-chip bonded to the Au films 42 of the connection portions B of the third wiring patterns 32*b* by a similar method to that of the first embodiment. Thereafter, similar to the first embodiment, the gap under the upper semiconductor chip 20*x* is filled with underfill resin 35.

In this way, a semiconductor device 1*a* (electronic parts packaging structure) of the second embodiment is obtained.

In the second embodiment, similar effects to those of the first embodiment are exerted. In addition to this, since the semiconductor chip 20*a* having the protection film 44 on the backside thereof is used, the manufacturing method is simplified compared to a method in which a second insulating film for covering the semiconductor chip is formed as in the first embodiment, and the cost of manufacture can be reduced. Moreover, a semiconductor device can be made thinner than the first embodiment by use of the semiconductor chip 20*a* having the protection film 44 on the backside thereof.

Third Embodiment

FIGS. 3A to 3E are sectional views showing a method of manufacturing an electronic parts packaging structure of a third embodiment of the present invention in order. The third embodiment is different from the first and second embodiments in that, after a semiconductor chip is flip-chip mounted, via holes penetrating the semiconductor chip are formed therein, thus achieving mutual connection. In the third embodiment, similar steps to those of the first embodiment will not be further described in detail.

Figure 3A:
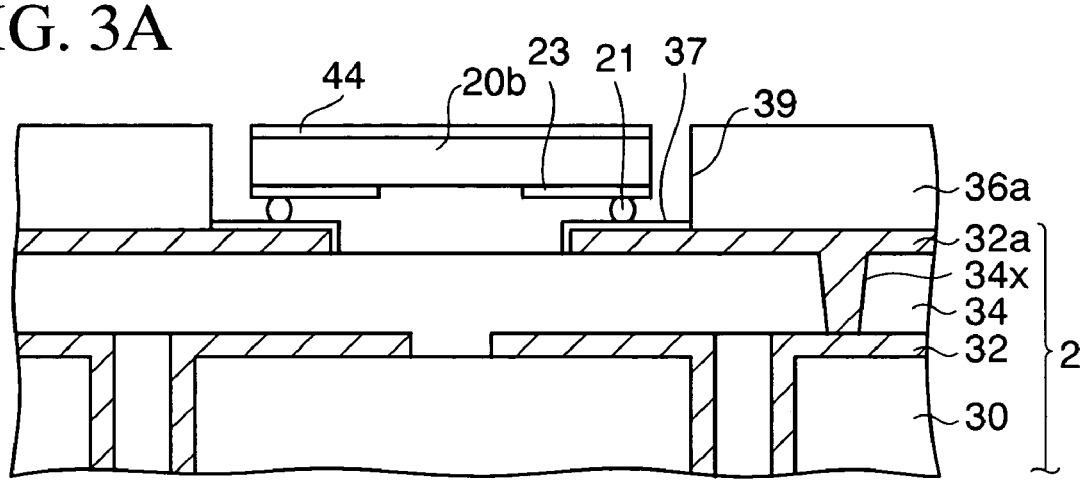
FIGS. 3A to 3E are sectional views showing a method of manufacturing an electronic parts packaging structure of a third embodiment of the present invention.

In the method of manufacturing the electronic parts packaging structure of the third embodiment, as shown in FIG. 3A, first, a wiring substrate 2 having a similar structure to that of FIG. 1C in the first embodiment is prepared. Thereafter, a semiconductor chip 20*b*, which has connection pads 23 and bumps 21 connected thereto on an element formation surface thereof and has a protection film 44 similar to that of the second embodiment on the backside thereof, is prepared. Although not clearly shown, the connection pads 23 of the semiconductor chip 20*b* are obtained by rearranging electrode pads (not shown), which are arranged on the peripheral portion of the semiconductor chip 20*b* in a peripheral type arrangement, to an area array type arrangement by rewiring with Cu wirings.

Next, the bumps 21 of the semiconductor chip 20*b* are flip-chip bonded to Au films 37 of connection portions B of second wiring patterns 32*a* by a similar method to that of the first embodiment. The connection pads 23 and the bumps 21 connected thereto are examples of connection terminals.

Figure 3B:
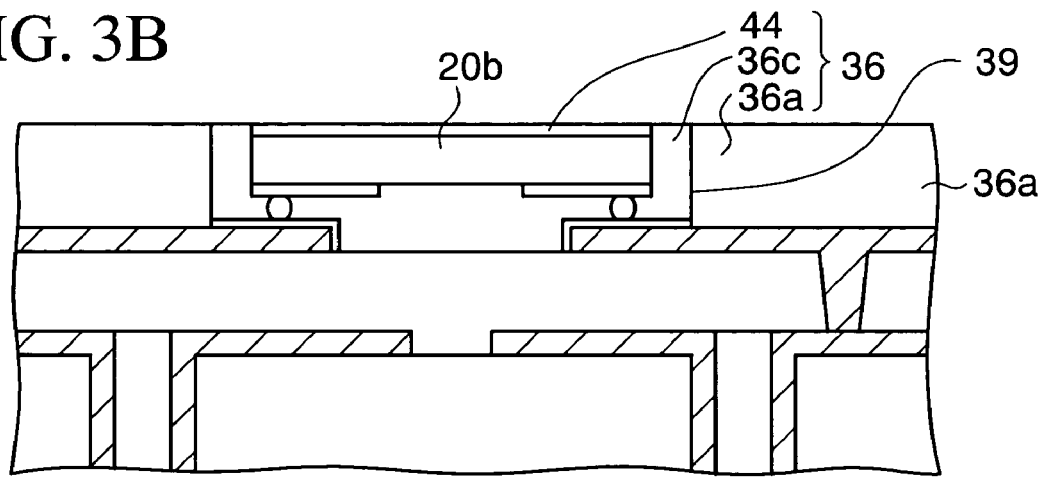

Subsequently, as shown in FIG. 3B, the gap under the under surface of the semiconductor chip 20*b* and the gap adjacent to the side surfaces thereof are filled with underfill resin 36*c* (filling insulating film) by a similar method to that of the first embodiment. Thus, similar to the second embodiment, a planarized second interlayer insulating film 36 composed of the insulating film 36*a*, the protection film 44 and the underfill resin 36*c* is obtained.

Figure 3C:
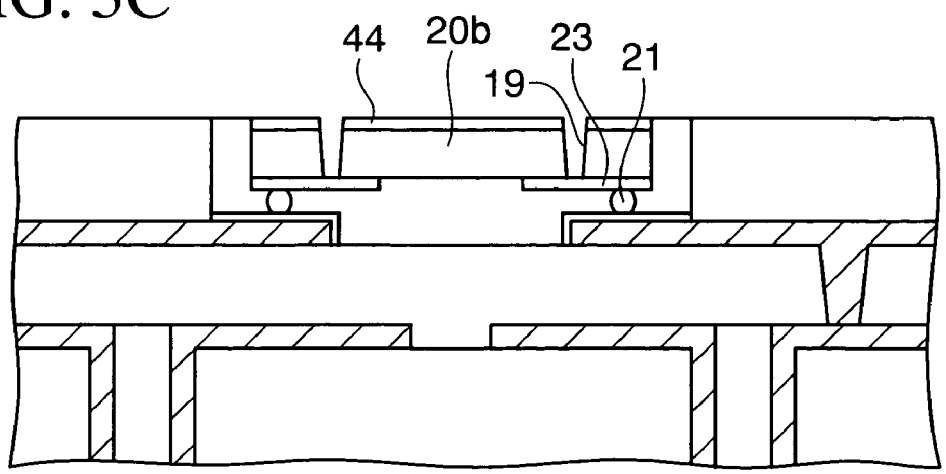

Then, as shown in FIG. 3C, second via holes 19 having depths reaching the connection pads 23 are formed by a laser or RIE in predetermined portions of the semiconductor chip 20*b* and the protection film 44 on the areas of the connection pads 23 except the areas to which the bumps 21 are bonded.

The reason for forming the second via holes 19 on the connection pads in the areas except the areas to which the bumps 21 are bonded is that, if the second via holes 19 are formed above the areas to which the bumps 21 are bonded, damage can be caused at the joints between the connection pads 23 and the bumps 21 by a laser or RIE to lower reliability of bonding.

Figure 3D:
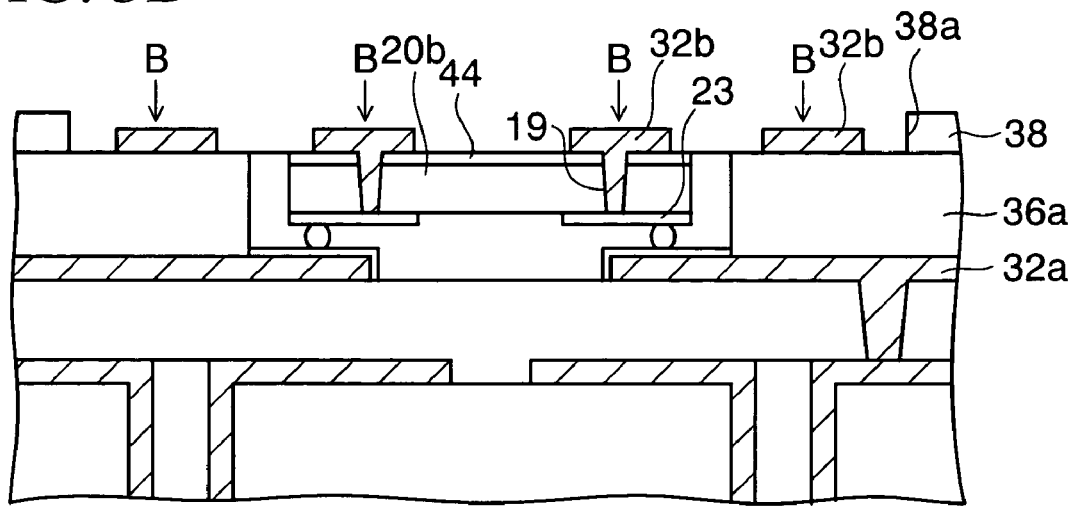

Next, as shown in FIG. 3D, third wiring patterns 32*b* (upper wiring patterns) connected to the connection pads 23 through the second via holes 19 formed in the semiconductor chip 20*b* are formed on the protection film 44 and the insulating film 36*a* through a semi-additive process, which has been described in the first embodiment, or the like.

Subsequently, similar to the first embodiment, a solder resist film 38 having an opening portion 38*a* for exposing connection portions B of the third wiring patterns 32*b* in a lump is formed.

Figure 3E:
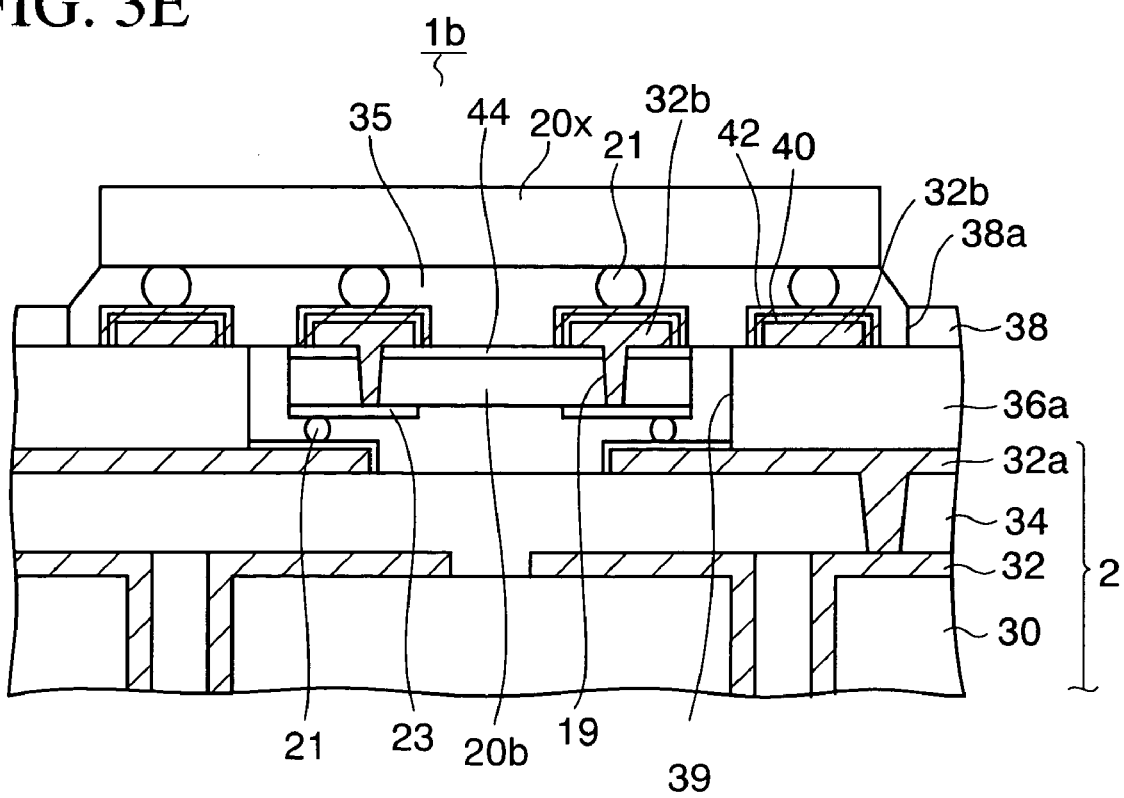

Then, as shown in FIG. 3E, Ni films 40 and Au films 42 are sequentially formed on the respective connection portions B of the third wiring patterns 32*b* exposed in the opening portion 38a of the solder resist film 38 by a similar method to that of the first embodiment. Furthermore, after bumps 21 of an upper semiconductor chip 20x (upper electronic parts) having the bumps 21 are flip-chip bonded to the Au films 42 of the connection portions B of the third wiring patterns 32b, the gap under the under surface of the upper semiconductor chip 20x is filled with underfill resin 35.

In this way, a semiconductor device 1b (electronic parts packaging structure) of the third embodiment is completed.

Figure 4:
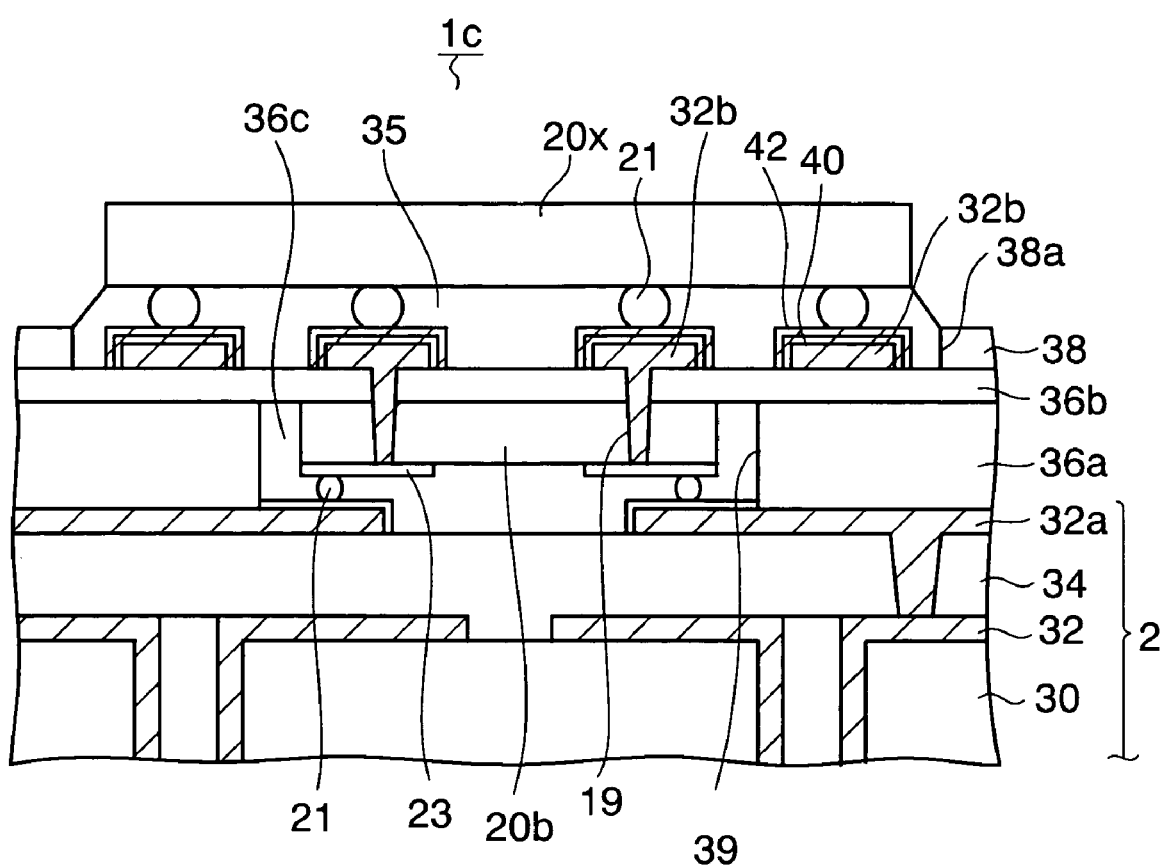
FIG. 4 is a sectional view showing an electronic parts packaging structure of a modified example of the third embodiment of the present invention.

Next, an electronic parts packaging structure of a modified example of the third embodiment will be described. FIG. 4 is a sectional view showing the electronic parts packaging structure according to the modified example of the third embodiment of the present invention.

As shown in FIG. 4, in a semiconductor device 1c of the modified example of the third embodiment, a semiconductor chip 20b having no protection film 44 on the backside thereof is used. Moreover, after the semiconductor chip 20b is flip-chip bonded to second wiring patterns 32a and underfill resin 36c is filled, a second insulating film 36b is formed on the semiconductor chip 20b similarly to the first embodiment.

Further, in the present modified example, the second insulating film 36b for covering the semiconductor chip 20b and the semiconductor chip 20b are etched by a laser or RIE in the step of forming second via holes 19. Furthermore, third wiring patterns 32b are formed on the second insulating film 36b. Other components are the same as those of FIG. 3E and therefore will not be further described.

The third embodiment has similar effects to those of the first embodiment. In addition to this, since mutual connection is achieved through the via holes 19 formed in the semiconductor chip 20b, wiring length can be shortened. Therefore, it can respond to speeding up of a signal speed in semiconductor devices for high-frequency applications.

Fourth Embodiment

FIGS. 5A to 5G are sectional views showing a method of manufacturing an electronic parts packaging structure of a fourth embodiment of the present invention in order. The fourth embodiment is different from the first to third embodiments in that a semiconductor chip is mounted face up. In the fourth embodiment, similar steps to those of the first embodiment will not be further described in detail.

Figure 5A:
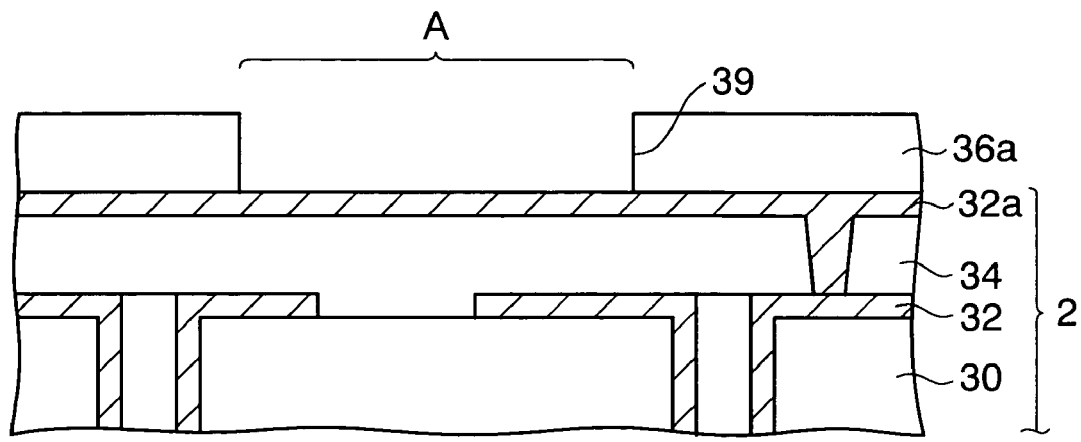
FIGS. 5A to 5G are sectional views showing a method of manufacturing an electronic parts packaging structure of a fourth embodiment of the present invention in order.

In the method of manufacturing the electronic parts packaging structure of the fourth embodiment, as shown in FIG. 5A, first, a wiring substrate 2 similar to that of FIG. 1C in the first embodiment is prepared. Thereafter, a first insulating film 36a having an opening portion 39 in a packaging area A is formed on the wiring substrate 2 by a similar method to that of the first embodiment.

In the present embodiment, a semiconductor chip is mounted face up in the packaging area A (opening portion 39). Therefore, unlike the first to third embodiments, an Au film does not need to be formed in a portion of a second wiring pattern 32a in the packaging area A. In addition to this, the packaging area A of the wiring substrate 2 exposed in the opening portion 39 of the first insulating film 36a may be any one of a portion of the second wiring pattern 32a as shown in FIG. 5A, a portion of a first interlayer insulating film 34, and a portion in which the second wiring pattern 32a and the first interlayer insulating film 34 exist together.

Figure 5B:
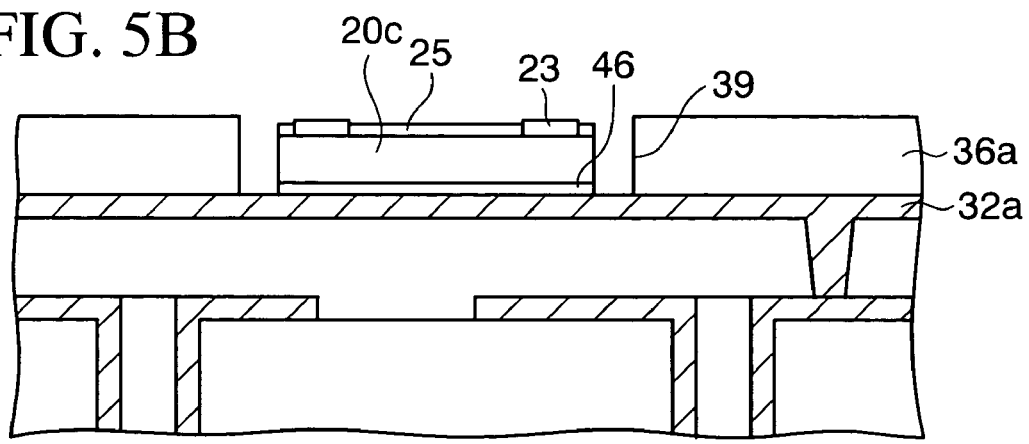

Next, a semiconductor chip 20c (electronic parts) as shown in FIG. 5B is prepared. In the semiconductor chip 20c, connection pads 23 (connection terminals) are provided on an element formation surface thereof, and the other portion thereof is covered with a passivation film 25. Subsequently, the semiconductor chip 20c is fixed on the second wiring pattern 32a exposed in the opening portion 39 of the first insulating film 36a, with an adhesive layer 46 interposed therebetween in the state where the connection pads 23 of the semiconductor chip 20c are directed upward (face up).

At this time, the element formation surface of the semiconductor chip 20c and the upper surface of the first insulating film 36a come to be at almost the same height, thus eliminating steps due to the thickness of the semiconductor chip 20c.

Figure 5C:
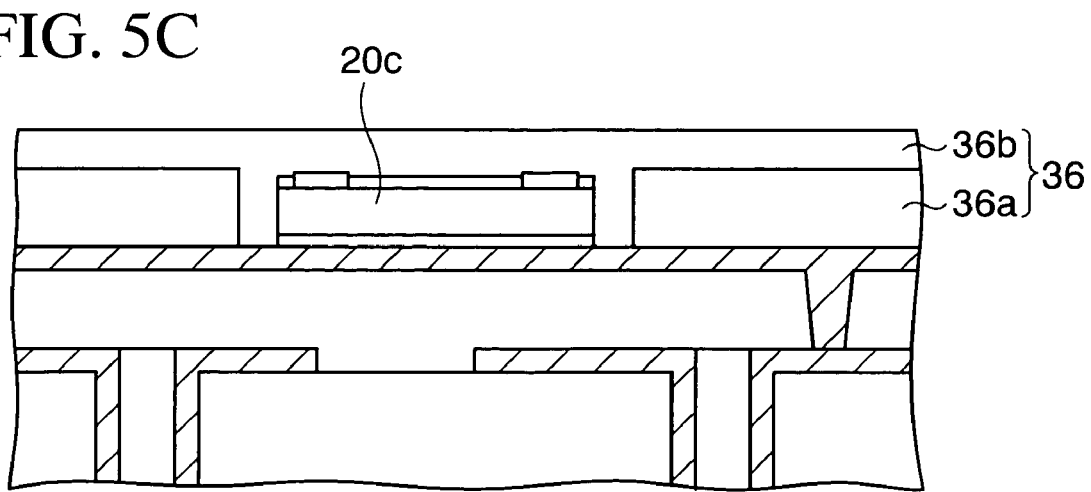

Next, as shown in FIG. 5C, a second insulating film 36b is formed on the semiconductor chip 20c and the first insulating film 36a. The second insulating film 36b is formed using material and a method similar to those of the first embodiment.

The second insulating film 36b is formed in the state where the upper surface thereof is planarized without being affected by steps due to the thickness of the semiconductor chip 20c. At this time, the gap between the side surfaces of the semiconductor chip 20c and those of the opening portion 39 of the first insulating film 36a is filled with the second insulating film 36b to be planarized.

Thus, a second interlayer insulating film 36 composed of the first and second insulating films 36a and 36b is obtained, and a structure in which the semiconductor chip 20c is buried in the planar second interlayer insulating film 36 and mounted face up, is formed.

Figure 5D:
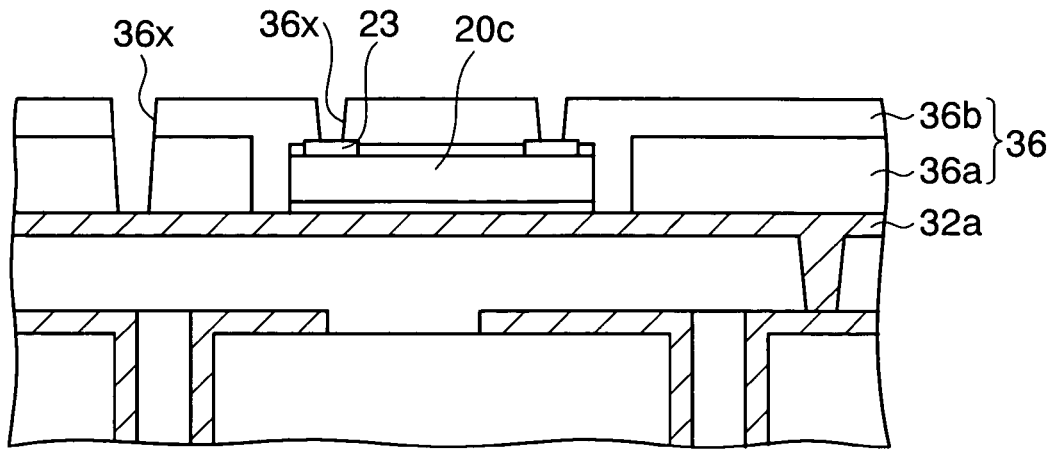

Next, as shown in FIG. 5D, predetermined portions of the second interlayer insulating film 36 on the connection pads 23 of the semiconductor chip 20c are etched by a laser or RIE, thereby forming second via holes 36x having depths reaching the connection pads 23. At this time, a predetermined portion of the second interlayer insulating film 36 on the second wiring pattern 32a is simultaneously etched, thereby simultaneously forming a second via hole 36x having a depth reaching the second wiring pattern 32a.

Figure 5E:
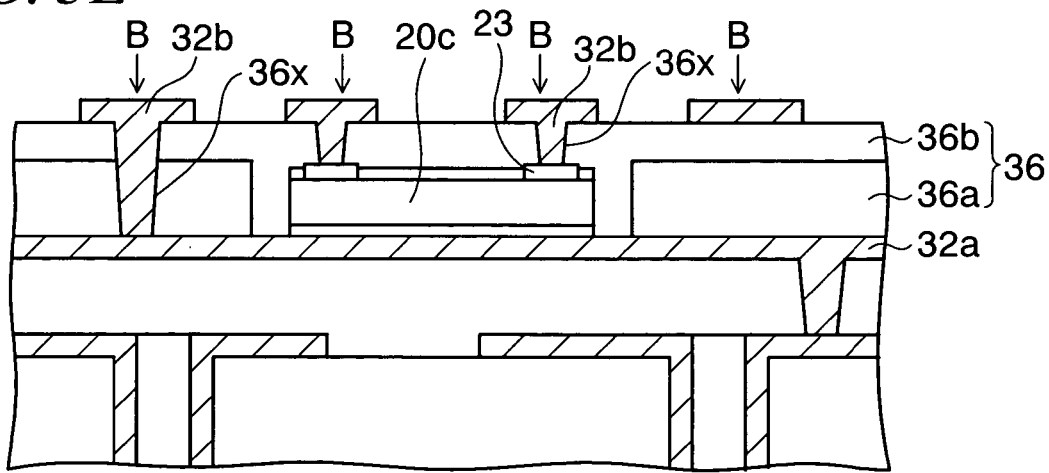

Subsequently, as shown in FIG. 5E, third wiring patterns 32b (upper wiring patterns), respectively connected to the connection pads 23 of the semiconductor chip 20c and the second wiring pattern 32a through the second via holes 36x, are formed on the second interlayer insulating film 36 through a semi-additive process, which is described in the first embodiment.

Incidentally, the process from the step (FIG. 5B) of mounting the semiconductor chip 20c face up in the opening portion 39 of the first insulating film 36a to the step (FIG. 5E) of forming the third wiring patterns 32b may be repeated with a predetermined number of times. In this case, a packaging structure in which a plurality of semiconductor chips 20c are buried face up in respective interlayer insulating films and mutually connected through via holes can be easily obtained without the occurrence of any trouble.

Figure 5F:
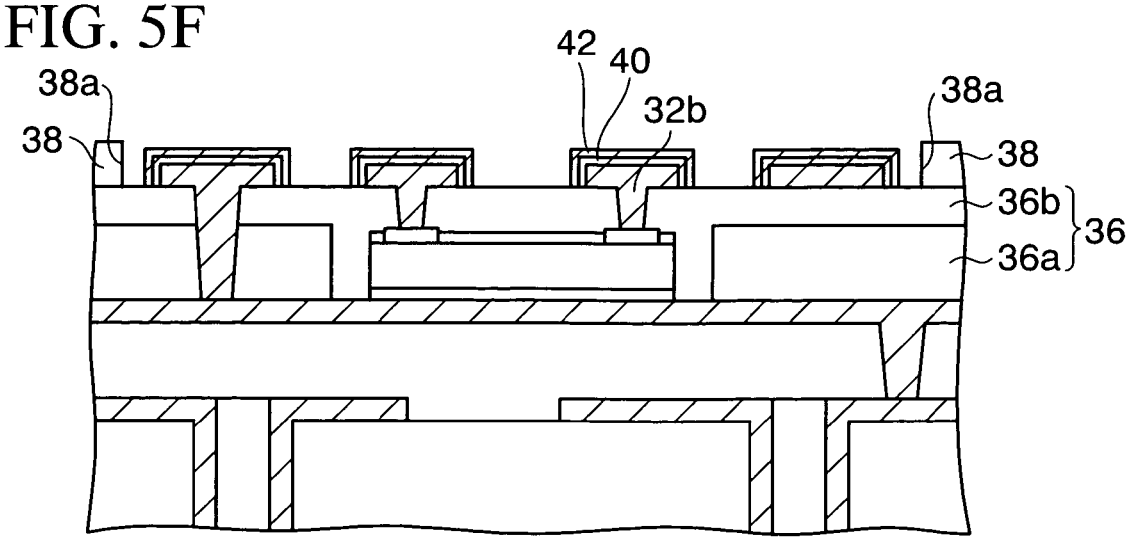

Next, as shown in FIG. 5F, similar to the first embodiment, a solder resist film 38 having an opening portion 38a for exposing respective connection portions B of the third wiring patterns 32b in a lump is formed. Then, Ni films 40 and Au films 42 are sequentially formed on the third wiring patterns 32b exposed in the opening portion 38a of the solder resist film 38.

Figure 5G:
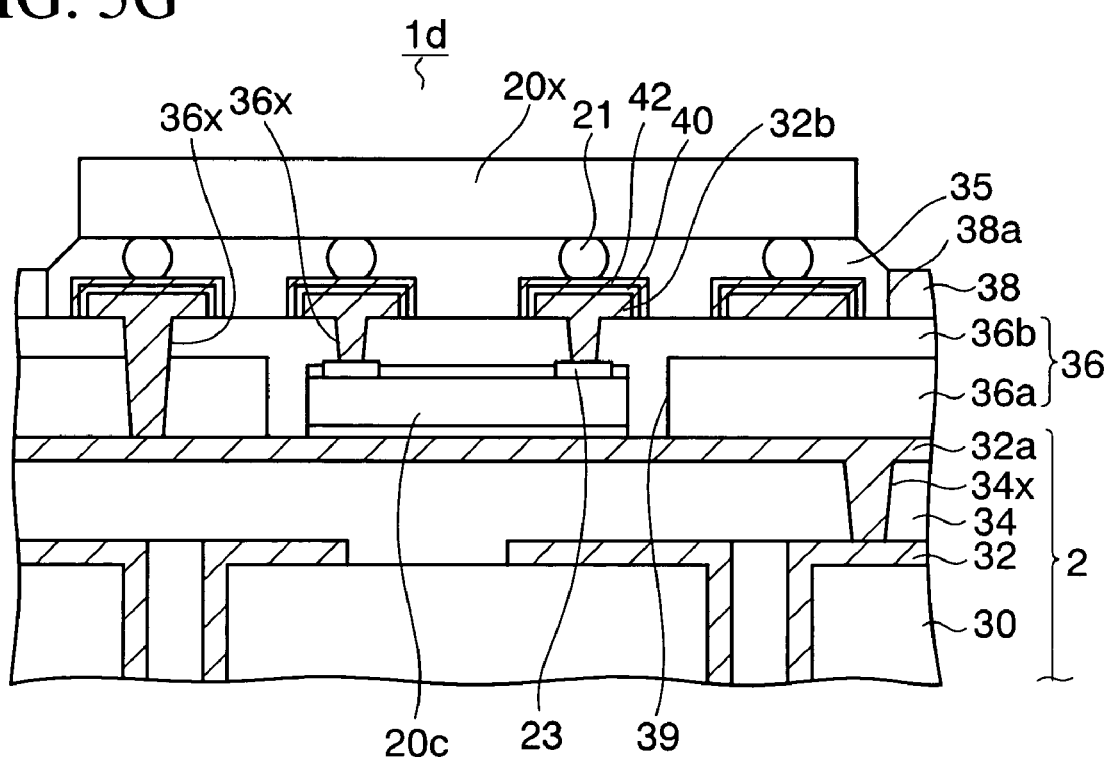

Subsequently, as shown in FIG. 5G, an upper semiconductor chip 20x (upper electronic parts) having bumps 21 is prepared, and the bumps 21 of the upper semiconductor chip 20x are flip-chip bonded to the Au films 42 of the connection portions B of the third wiring patterns 32b. Then, similar to the first embodiment, the gap under the under surface of the upper semiconductor chip 20x is filled with underfill resin 35.

In this way, a semiconductor device 1d (electronic parts packaging structure) of the fourth embodiment is completed.

In the semiconductor device 1d of the fourth embodiment, the first insulating film 36a having the opening portion 39 in the packaging area A is formed on the wiring substrate 2. Moreover, the semiconductor chip 20c is mounted in the opening portion 39 of the first insulating film 36a in the state where the connection pads 23 of the semiconductor chip 20c are directed upward (face up). Thus, steps due to the thickness of the semiconductor chip 20c are eliminated with the first insulating film 36a.

Furthermore, the second insulating film 36b for covering the semiconductor chip 20c is formed in the state where the upper surface of the second insulating film 36b is planarized, and the second interlayer insulating film 36 is composed of the first and second insulating films 36a and 36b. Thus, the semiconductor chip 20c is mounted face up in the state of being buried in the planar second interlayer insulating film 36.

In addition, a second via holes 36x are formed in the second interlayer insulating film 36 on the connection pads 23 of the semiconductor chip 20c and the second wiring pattern 32a respectively. Further, the third wiring patterns 32b connected to the connection pads 23 and the second wiring pattern 32a through the second via holes 36x, are formed on the second interlayer insulating film 36. Furthermore, the bumps 21 of the upper semiconductor chip 20x are flip-chip bonded to the connection portions B of the third wiring patterns 32b.

Figure 6:
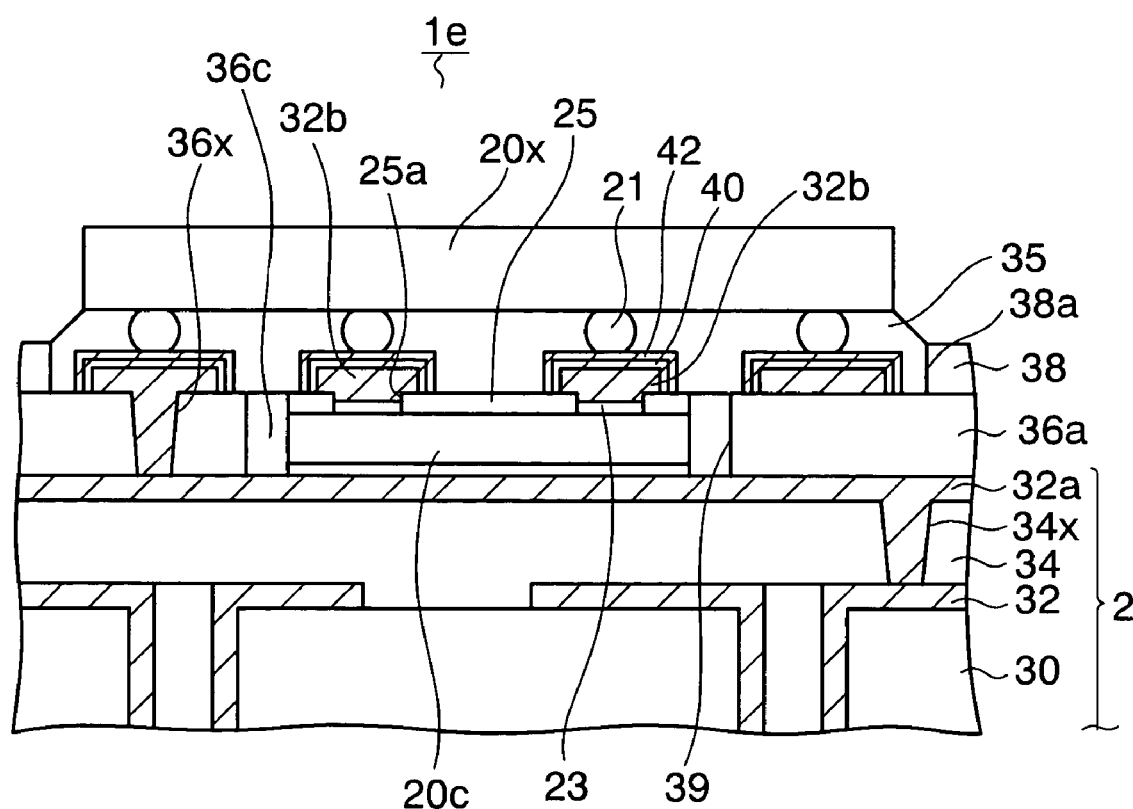
FIG. 6 is a sectional view showing an electronic parts packaging structure of a modified example of the fourth embodiment of the present invention.

Next, an electronic parts packaging structure of a modified example of the fourth embodiment will be described. FIG. 6 is a sectional view showing the electronic parts packaging structure according to the modified example of the fourth embodiment of the present invention. As shown in FIG. 6, in a semiconductor device 1e of the modified example of the fourth embodiment, a second insulating film 36b is not formed on a semiconductor chip 20c. In the case of this mode, an insulating film which has high reliability of dielectric resistance, and which has opening portions 25a on connection pads 23, is used as a passivation film 25 of the semiconductor chip 20c.

For such a passivation film 25, the material and thickness thereof are not particularly limited. However, for example, the passivation film 25 is composed of a silicon nitride film having a thickness of approximately 0.5 μm and a polyimide resin film having a thickness of approximately 3 μm or more. Further, a resin film having opening portions for exposing the connection pads 23 may be attached to the semiconductor chip 20c to become the passivation film 25.

Subsequently, the gap between the side surfaces of the semiconductor chip 20c and those of the opening portion 39 of the first insulating film 36a is filled with underfill resin 36c to completely achieve planarization. Then, the first insulating film 36a on a second wiring pattern 32a is etched, thereby forming a second via holes 36x.

Thereafter, third wiring patterns 32b which are connected to the second wiring pattern 32a through the second via holes 36x and which are connected to the connection pads 23 through the opening portions 25a of the passivation film 25 are formed on the first insulating film 36a and the passivation film 25. By adopting the modified example as described above, a second insulating film 36b for covering the semi-conductor chip 20c can be omitted. Other components are the same as those of FIG. 5G and therefore will not be further described.

In the fourth embodiment, the semiconductor chip 20c is mounted face up in the opening portion 39 of the first insulating film 36a. Accordingly, similar to the case where a semiconductor chip is flip-chip mounted face down as in the first to third embodiments, steps due to the thickness of the semiconductor chip 20c are easily eliminated with the first insulating film 36a. Therefore, the fourth embodiment has similar effects to those of the first embodiment.

What is claimed is:

1. An electronic parts packaging structure comprising:
   a wiring substrate having a wiring pattern;
   a first insulating film formed on the wiring substrate, the first insulating film having an opening portion in a packaging area in which an electronic parts is mounted;
   the electronic parts having a connection terminal flip-chip mounted on the wiring pattern exposed in the opening portion of the first insulating film;
   a second insulating film for covering the electronic parts;
   a via hole formed in a predetermined portion of the first and second insulating films on the wiring pattern, the via hole having same side surface;
   an upper wiring pattern composed of a seed film and a film pattern formed as a single wiring on an inner surface of the via hole and on the second insulating film, and connected to the wiring pattern through the via hole; and
   an upper electronic parts having a connection terminal flip-chip mounted on a portion of the upper wiring pattern which directly contacts an upper surface of the second insulating film.

2. The electronic parts packaging structure according to claim 1, wherein the connection terminal of the electronic parts is made of gold, a gold film is formed on a surface of the wiring pattern in the opening portion of the insulating film, and the connection terminal of the electronic parts is flip-chip mounted on the wiring pattern by gold-gold bonding.

3. The electronic parts packaging structure according to claim 1, wherein a structure in which the electronic parts is flip-chip mounted in the opening portion of the insulating film includes a structure in which a filling insulating film is formed in at least a gap between the electronic parts and the wiring substrate out of a gap between the electronic parts and the wiring substrate and a gap between the electronic parts and side surfaces of the opening portion.

4. The electronic parts packaging structure according to claim 1, wherein an upper surface of the electronic parts and an upper surface of the insulating film having the opening portion are adjusted to an almost same height.

5. The electronic parts packaging structure according to claim 1, wherein a solder resist film having an opening portion opening a packaging area in which the upper electronic parts is mounted, in a lump, is formed on the insulating film and the upper wiring pattern, and a filling insulating film is formed in a gap under an under surface of the upper electronic parts.

6. The electronic parts packaging structure according to claim 1, wherein the electronic parts is a semiconductor chip having a thickness of approximately 150 μm or less, and the insulating film is made of resin.

* * * * *